United States Patent [19]
Schouhamer Immink

[11] Patent Number: 5,920,272
[45] Date of Patent: *Jul. 6, 1999

[54] RECORD CARRIER CONTAINING A SIGNAL HAVING A SEQUENCE OF SUCCESSIVE INFORMATION SIGNAL PORTIONS

[75] Inventor: Kornelis A. Schouhamer Immink, Eindhoven, Netherlands

[73] Assignee: U.S. Philips Corporation, New York, N.Y.

[ * ] Notice: This patent is subject to a terminal disclaimer.

[21] Appl. No.: 08/900,275

[22] Filed: Jul. 25, 1997

Related U.S. Application Data

[63] Continuation of application No. 08/385,533, Feb. 8, 1995, Pat. No. 5,696,505.

[30] Foreign Application Priority Data

Feb. 15, 1994 [EP] European Pat. Off. .............. 94200387

[51] Int. Cl.$^6$ ...................................................... H03M 7/00
[52] U.S. Cl. ............................................... 341/59; 341/95
[58] Field of Search ................... 341/58, 59, 95, 341/106

[56] References Cited

U.S. PATENT DOCUMENTS

| | | | |
|---|---|---|---|
| 4,517,552 | 5/1985 | Shirota et al. | 340/347 |
| 4,520,346 | 5/1985 | Shimada | 340/347 |
| 4,683,572 | 7/1987 | Baggen et al. | 371/37 |
| 4,833,470 | 5/1989 | Iketani | 341/59 |
| 4,855,742 | 8/1989 | Verboom | 341/102 |
| 5,048,003 | 9/1991 | Baggen et al. | 369/59 |
| 5,696,505 | 12/1997 | Shouhammer Immink | 341/59 |

*Primary Examiner*—Marc S. Hoff
*Assistant Examiner*—Peguy JeanPierre
*Attorney, Agent, or Firm*—Edward Blocker

[57] ABSTRACT

A series of m-bit information words is converted to a modulated signal. For each information word from the series, an n-bit code word is delivered. The delivered code words are converted to the modulated signal. The code words are distributed over at least one group of a first type and at least one group of a second type. When a code word belonging to a group of the first type is delivered, its group establishes a coding state of a first type. When a code word belonging to a group of the second type is delivered, a coding state of a second type is established which is determined by the information word which is to be converted to the delivered code word. When one of the code words is assigned to the received information word, this code word is selected from a set of code words which depends on the coding state established. The sets of code words belonging to the coding states of the second type are disjunct. In this coding method, the number of unique bit combinations that may be established by the code words in the series are enlarged.

16 Claims, 20 Drawing Sheets

| | $v_1$ | | $v_2$ | | $v_3$ | | $v_4$ | |
|---|---|---|---|---|---|---|---|---|
| 155 | 0010000100000100 | 3 | 0010000100000100 | 3 | 0100010000001000 | 3 | 0100010000001000 | 3 |
| 156 | 0010000100100100 | 3 | 0010000100100100 | 3 | 1000010001001001 | 1 | 1000010001001001 | 1 |
| 157 | 0010010010001000 | 3 | 0100010010000010 | 3 | 0010010000001000 | 3 | 0100100100000010 | 1 |
| 158 | 0010010010000100 | 3 | 0010010010000100 | 3 | 1000010010001000 | 3 | 0100100010000000 | 4 |
| 159 | 0010010100010000 | 3 | 0010010010000010 | 1 | 0100010010001000 | 2 | 0100010001001000 | 2 |
| 160 | 0000010010000001 | 1 | 0010010010000100 | 1 | 1000010010001000 | 2 | 0100010010001000 | 2 |
| 161 | 0000010000100001 | 1 | 0100010000010000 | 1 | 1000000010001001 | 1 | 0100010000010000 | 3 |
| 162 | 0000010000000010 | 1 | 0000010000000010 | 1 | 1000010000000010 | 2 | 0100010010000010 | 1 |
| 163 | 0000010000001001 | 1 | 0100010000001001 | 1 | 1000001000000100 | 1 | 0100010000100000 | 2 |
| 164 | 0000010000010010 | 1 | 0000010000010010 | 1 | 0100000100001000 | 1 | 0100010001000010 | 1 |
| 165 | 0000010000010001 | 1 | 0100010001000100 | 1 | 0100100010001010 | 2 | 0100010001010000 | 1 |
| 166 | 0000100000100001 | 1 | 0000100000100001 | 1 | 1000010000001000 | 3 | 1000010001000100 | 1 |
| 167 | 0000100001000010 | 1 | 0000100001000010 | 1 | 0100100010001000 | 1 | 0100100010000100 | 1 |
| 168 | 0000100001000100 | 1 | 0000100001000100 | 1 | 0010001000010010 | 1 | 0110001000010010 | 1 |
| 169 | 0000100010001000 | 1 | 0000100010001000 | 1 | 1000010000001001 | 1 | 0100100100001000 | 1 |
| 170 | 0000100010010000 | 1 | 0001000100010000 | 1 | 0010001001001001 | 1 | 1000100000100010 | 1 |
| 171 | 0001000100000010 | 1 | 0010001000010010 | 1 | 0000001001010001 | 1 | 1000010000010000 | 2 |
| 172 | 0001000100010010 | 1 | 0000100010010010 | 1 | 1000010000100001 | 1 | 1000100000100010 | 1 |
| 173 | 0001000100100001 | 1 | 0000100100010001 | 1 | 1000100010010001 | 1 | 1000100010010001 | 1 |
| 174 | 0001000100100010 | 1 | 0001000100100010 | 1 | 1000100100100001 | 1 | 1000100001000010 | 1 |
| 175 | 0001000001000010 | 1 | 0100010000000001 | 1 | 1000100000100001 | 1 | 1000100010000001 | 1 |
| 176 | 0001000010000001 | 1 | 0001000010000001 | 1 | 0100010010000010 | 1 | 0100100001000010 | 1 |
| 177 | 0001000100000010 | 1 | 0001000100000010 | 1 | 1000010010010010 | 1 | 1000100001000010 | 1 |
| 178 | 0001001001000010 | 1 | 0001001001000010 | 1 | 1000100010010001 | 1 | 1000100010010001 | 1 |
| 179 | 0001000010000010 | 1 | 0001000010000010 | 1 | 1000100100100010 | 1 | 1000100001000010 | 1 |
| 180 | 0001001000100010 | 1 | 0100100000100010 | 1 | 0100100010000100 | 1 | 0100100010001000 | 1 |
| 181 | 0001000100100001 | 1 | 0001000100100001 | 1 | 0100100100000010 | 1 | 0100100100001000 | 1 |
| 182 | 0010000000010010 | 1 | 0010000000010010 | 1 | 1000100001000001 | 1 | 1000100001001000 | 1 |
| 183 | 0010000100000010 | 1 | 0010000100000010 | 1 | 0010010001000001 | 1 | 0100010010001000 | 3 |
| 184 | 0010000100000001 | 1 | 0010000100000001 | 1 | 1000010000000001 | 1 | 0100100100000100 | 1 |
| 185 | 0010000100000010 | 1 | 0010000100000010 | 1 | 1000010000000100 | 2 | 1000100100001000 | 2 |

| | $v_1$ | | $v_2$ | | $v_3$ | | $v_4$ | |
|---|---|---|---|---|---|---|---|---|
| 248 | 000100100000101 | 1 | 010000010000010 | 1 | 000100100000001 | 1 | 010000010000010 | 1 |
| 249 | 000100100010010 | 1 | 000100001000010 | 1 | 100010000010001 | 1 | 100010001001001 | 1 |
| 250 | 001001010000001 | 1 | 001001001000001 | 1 | 100010000100001 | 1 | 100100010010001 | 1 |
| 251 | 001001000000010 | 1 | 001001000100010 | 1 | 100100100010001 | 1 | 100100100001001 | 1 |
| 252 | 001001000010001 | 1 | 010010001000010 | 1 | 001001000000001 | 1 | 010000100010010 | 1 |
| 253 | 001001000010010 | 1 | 001001000010010 | 1 | 010000010000001 | 1 | 010000100001001 | 1 |
| 254 | 000000010000100 | 2 | 010010000010001 | 2 | 100000010000100 | 2 | 010010000010001 | 2 |
| 255 | 000000100100100 | 2 | 010010000100010 | 2 | 100000010010100 | 2 | 010010000100010 | 2 |

FIG. 2J

| | $v_1$ | | $v_2$ | | $v_3$ | | $v_4$ | |
|---|---|---|---|---|---|---|---|---|
| 0 | 0001001000000000 | 4 | 0001001000000000 | 4 | 1001000001001000 | 2 | 1001000001001000 | 2 |
| 1 | 0000100100000000 | 4 | 0000100100000000 | 4 | 1001000010001000 | 3 | 1001000010001000 | 3 |
| 2 | 0000010010000000 | 4 | 0000010010000000 | 4 | 1001000000001001 | 1 | 1001000000001001 | 1 |
| 3 | 0100010010010000 | 1 | 0100100001010000 | 1 | 1000010000010000 | 4 | 0100010000000010 | 1 |
| 4 | 0000010100100000 | 3 | 0000100100100000 | 3 | 1000001001010000 | 3 | 0100010100000001 | 4 |
| 5 | 0000000100101000 | 3 | 0100100001001000 | 3 | 1000000010000000 | 3 | 0100010010000000 | 2 |
| 6 | 0000000100101000 | 3 | 0100100010001000 | 3 | 0000000001010000 | 2 | 0100010001000000 | 4 |
| 7 | 0000000000100100 | 2 | 0100100000001000 | 2 | 0000000010010000 | 2 | 0100010010000000 | 3 |
| 8 | 0000000100010100 | 2 | 0100000010001000 | 2 | 0000000010010000 | 2 | 0100010000100000 | 2 |
| 9 | 0000000010001100 | 2 | 0100000010001000 | 2 | 0000000001010000 | 4 | 0100010000100000 | 4 |
| 10 | 0010100001000000 | 4 | 0010000100000000 | 4 | 1001000001001000 | 3 | 1001000010001000 | 3 |
| 11 | 0001100010000000 | 4 | 0001000010000000 | 4 | 1001000010010000 | 3 | 1001000010010000 | 3 |
| 12 | 0000100000000000 | 4 | 0000100010000000 | 4 | 1001000000001001 | 3 | 1001000000001001 | 2 |
| 13 | 0001000100000000 | 3 | 0001000100010000 | 3 | 0100000001001000 | 3 | 0100010000100000 | 1 |
| 14 | 0000100010010000 | 3 | 0100100010010000 | 3 | 1000000001010000 | 2 | 0100000100000000 | 1 |
| 15 | 0000010001000100 | 2 | 0100010001000100 | 2 | 1001000010010000 | 1 | 0100010001001000 | 3 |
| 16 | 0000010010001000 | 2 | 0000010010001000 | 2 | 1001000010010000 | 1 | 1001000010010000 | 1 |
| 17 | 0000000100001000 | 1 | 0100010100000001 | 1 | 0100000100010000 | 1 | 0100000010000000 | 3 |
| 18 | 0000000010000100 | 1 | 0100010100000100 | 1 | 1001000000100000 | 3 | 1001000010000100 | 3 |
| 19 | 0000100001010000 | 1 | 0100000100001010 | 1 | 1001000010100000 | 2 | 1001000001100000 | 2 |
| 20 | 0000010000100000 | 1 | 0100010000010000 | 1 | 1001000000100000 | 3 | 0100000001010000 | 1 |
| 21 | 0010010000000000 | 2 | 0010010000000000 | 2 | 1001000001001000 | 3 | 1001000000100100 | 3 |
| 22 | 0001001000000000 | 1 | 0000100010000001 | 1 | 1001000010001000 | 2 | 1001000100001000 | 2 |
| 23 | 0000010000000001 | 1 | 0100100100000001 | 1 | 1001000010010000 | 3 | 1001000010010000 | 3 |
| 24 | 0000100010000001 | 1 | 0000100010000001 | 1 | 1000100001000000 | 2 | 0100010010010000 | 1 |
| 25 | 0000010001000001 | 1 | 0100001001000001 | 1 | 0100000100001000 | 1 | 0100010100001000 | 2 |
| 26 | 0000000010000001 | 1 | 0100000010010001 | 1 | 1001000000100000 | 1 | 1001000100000001 | 3 |
| 27 | 0000001001001000 | 1 | 0100100100001001 | 1 | 1001000100100000 | 1 | 1001000100000001 | 1 |
| 28 | 0000000010000001 | 1 | 0100100100010001 | 1 | 1001000000100000 | 1 | 1001000100100000 | 2 |
| 29 | 0000000001001001 | 1 | 0100001001001001 | 1 | 1001000010010000 | 1 | 1001001001010000 | 1 |
| 30 | 0010000100000000 | 4 | 0010000100000000 | 4 | 1001000000100100 | 2 | 1001000000100100 | 2 |

| IW | SWS | LB | DSV | CW | CS | ASDP | DSVN | LBN | SWN |
|---|---|---|---|---|---|---|---|---|---|
| "2" | S1 | H | 0 | (bit pattern) | * | −6 / +10 | −6 / +10 | 1 / 0 | S2 / S4 |
| "8" | S2 | L | −6 | (bit pattern) | * | −6 / +12 | 0 / −18 | 1 / 0 | S3 / S3 |
| "100" | S3 | H | 0 | (bit pattern) | * | −2 | −2 | 0 | S1 |
| "230" | S1 | H | −2 | (bit pattern) | * | +2 | 0 | 0 | S4 |
| "0" | S4 | H | 0 | (bit pattern) | * | −8 / +4 | −8 / +4 | 1 / 0 | S2 / S2 |
| "161" | S2 | H | +4 | (bit pattern) | * | −2 / +3 | +2 / +7 | 0 / 1 | S1 / S2 |
| "255" | S1 | H | +2 | (bit pattern) | * | +4 | +6 | 1 | S1 |

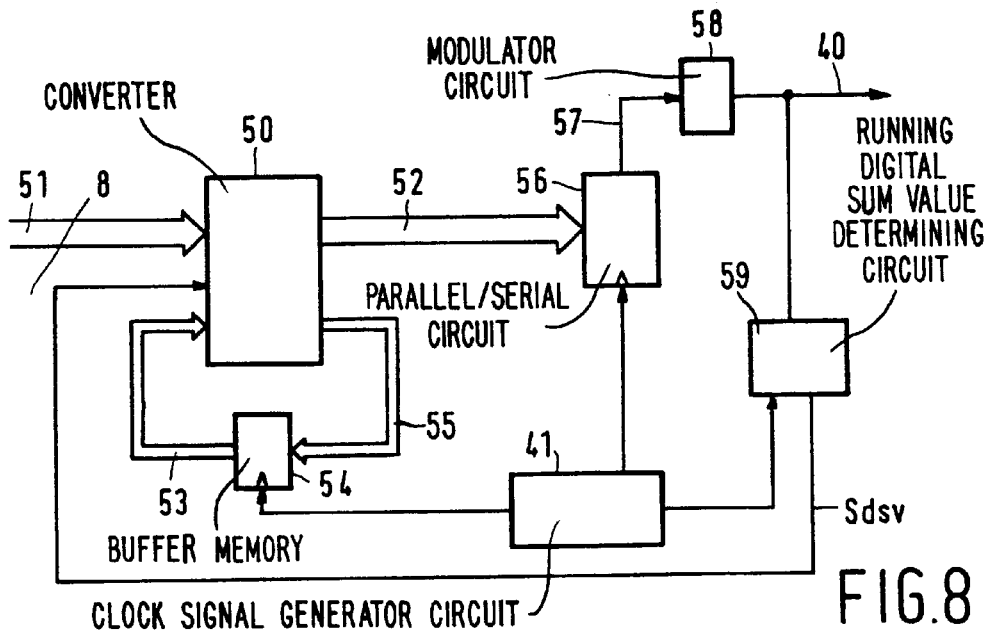
FIG.8
X1 · · · · · · · · · · · X13 · · · · · · · · · · · X26
1 0 0 1 0 0 0 0 0 0 0 0 1 0 0 0 0 0 0 0 0 0 0 0 0 1 —100
0 0 0 1 0 0 0 0 0 0 0 0 0 1 0 0 0 0 0 0 0 0 0 0 0 1 —101
FIG.9
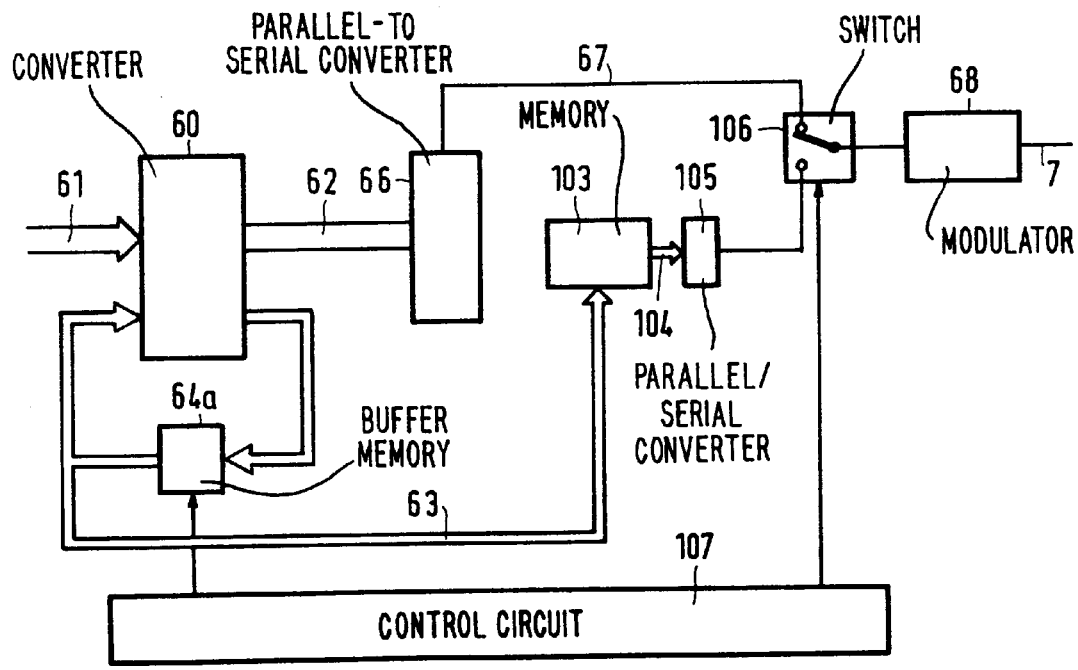
FIG.10

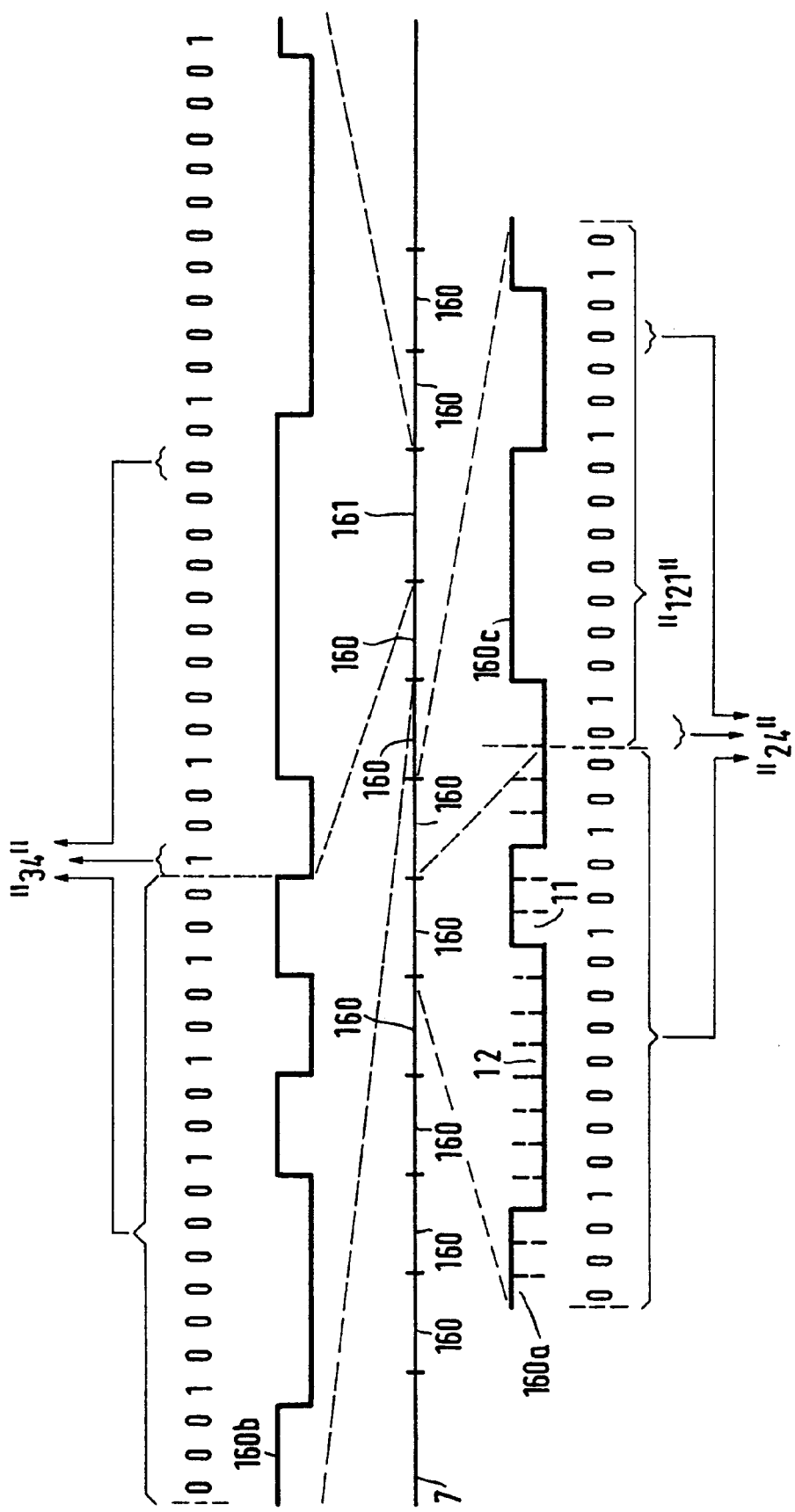

RECORD CARRIER CONTAINING A SIGNAL HAVING A SEQUENCE OF SUCCESSIVE INFORMATION SIGNAL PORTIONS

CROSS-REFERENCE TO RELATED APPLICATION

This is a continuation of application Ser. No. 08/385,533, filed Feb. 8, 1995, which has issued as U.S. Pat. No. 5,696,505 on Dec. 9, 1997.

BACKGROUND OF THE INVENTION

The invention relates to a record carrier, and more particularly, to a record carrier in which a signal having a sequence of successive information signal portions is recorded in a track.

A record carrier and related methods and devices for recording are published by K. A. Schouhamer Immink in the book entitled "Coding Techniques for Digital Recorders" (ISBN 0-13-140047-9). In said title, for example, the so-called EFM modulation system is described which is used for recording information on so-called Compact Discs. The EFM-modulated signal is obtained by converting a series of 8-bit information words to a series of 14-bit code words, three merging bits being inserted into the code words. The code words are selected such that the minimum number of "0" bits situated between the "1" bits is d (2) and the maximum number is k (10). This constraint is also referenced dk-constraint. The series of code words is converted, via a modulo-2 integration operation, to a corresponding signal formed by bit cells having a high or low signal value, a "1"-bit being represented in the modulated signal by a change from the high to the low signal value or vice versa. A "0"-bit is represented by the lack of a change of signal value at a transition between two bit cells. The merging bits are selected such that even in the regions of transition between two code words the dk-constraint is satisfied and that in the corresponding signal the so-called running digital sum value remains substantially constant. The running digital sum value at a specific instant is understood to mean the difference between the number of bit cells having the high signal value and the number of bit cells having the low signal value, calculated over the modulated signal portion situated before this instant. A substantially constant running digital sum value means that the frequency spectrum of the signal does not comprise frequency components in the low frequency area. Such a signal is also referenced a DC-free signal. The lack of low-frequency components in the signal is highly advantageous when the signal is read from a record carrier on which the signal is recorded in the track, because then continuous tracking control unaffected by the recorded signal is possible. Information recording has a constant need for enhancing the information density on the record carrier.

A possible solution to this is a reduction of the number of bit cells per information word in the modulated signal. However, the problem occurring then is that as a result of the reduction of this number of bit cells per information word the number of unique bit combinations which may represent the information words will decrease, due to which less strict constraints can be imposed on the modulated signal, for example, constraints as regards low-frequency contents of the modulated signal.

SUMMARY OF THE INVENTION

It is an object of the invention to provide a record carrier in which the number of bit cells per information word recorded thereon is reduced while counteracting a reduction in the number of unique bit combinations which may represent the information words In accordance with an aspect of the invention, a record carrier has a signal recorded in a track. The signal includes a sequence of successive information signal portions. Each signal portion represents an information word wherein each of the information signal portions includes n bit cells having a first or second signal value. A plurality of track information patterns represent the signal portions. The information signal portions are spread over at least one group of a first type and at least one group of a second type. Each information signal portion belonging to a group of the first type uniquely represents an information word and each information signal portion belonging to a group of the second type in combination with the signal values of p bit cells at predetermined positions in a following information signal portion represent a unique information word. Consequently, one information signal portion belonging to a group of the second type represents a plurality of information words among which the respective information word is distinguishable by the signal values.

It is a feature of the invention that each number of successive bit cells having a same signal value ranges from a minimum of $d+1$ to a naximum of $k+1$. At any arbitrary point in the signal the running value of the difference between the number of bit cells having the first signal value and the bit cells having the second signal value in the signal portion preceding this point is limited.

It is another feature of the invention that n is equal to 16, d is equal to 2 and k is equal to 10. The signal can include sync signal portions which have bit cell patterns that do not occur in the sequence of successive information signal portions, while a unique information word is established by each of the information signal portions of the second group combined with either an adjacent sync signal portion or an adjacent information signal portion.

It is yet another feature of the invention that p can be equal to 2. The information signal portions from the at least one group of the first type end in s bit cells can have a same signal value The information signal portions from the a&t least one group of the second type can end in t bit cells having the same signal value, wherein s and t can assume different values and wherein s and t are different in value, The value of t can be greater than or equal to 2 and smaller than or equal to 5.

It is still another feature of the invention that the track information patterns can include first and second parts alternating in the direction of the track. The first parts present detectable first properties. The second parts present second properties distinguishable from the first properties. Those parts having the first properties represent bit cells having the first signal value and chose parts having the second properties represent the bit cells having the second signal value. These properties can be optically detectable.

BRIEF DESCRIPTION OF THE DRAWINGS

The invention will be further explained with reference to the drawings, in which:

Figure 2A:
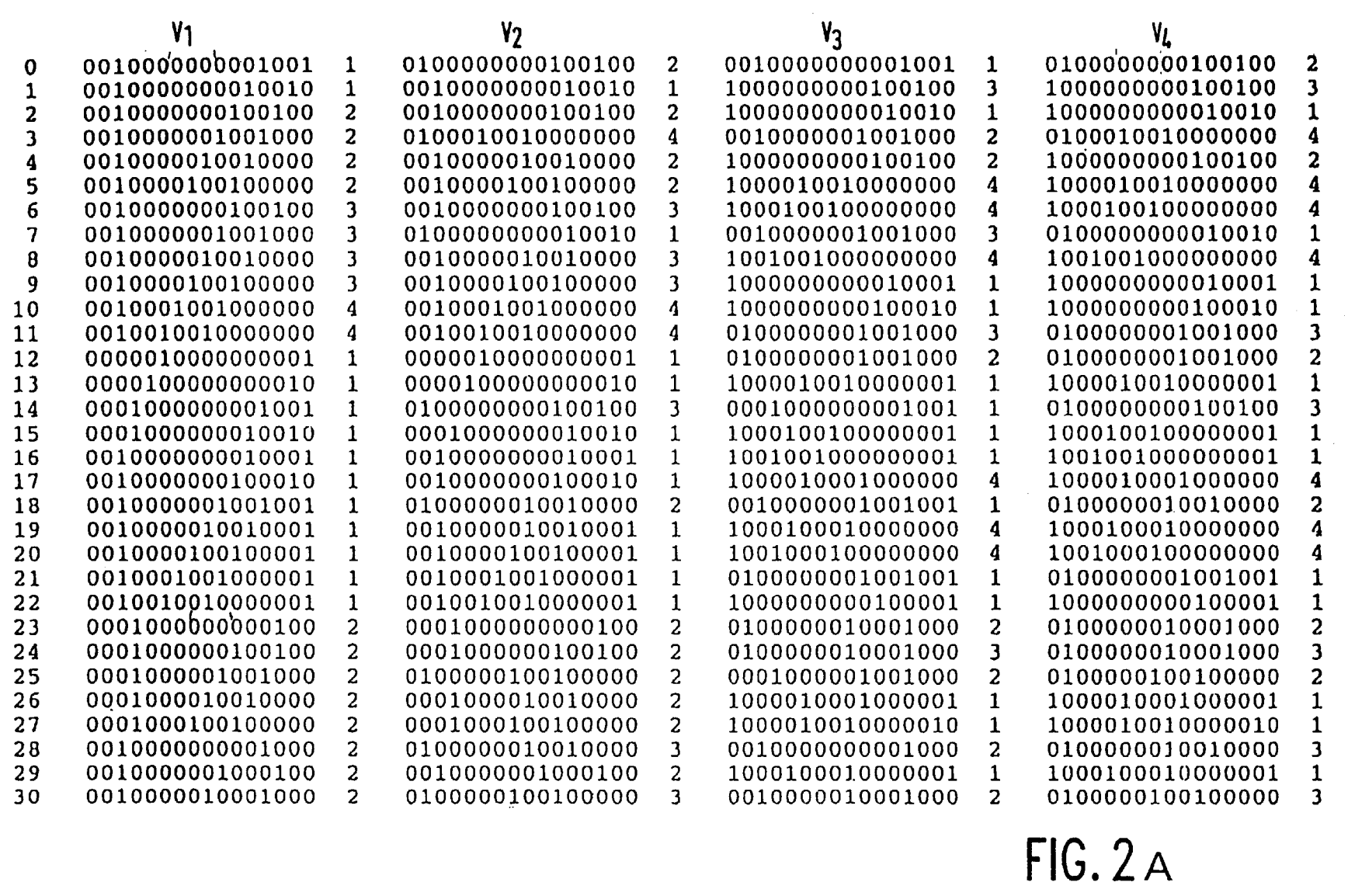
Figure 2B:
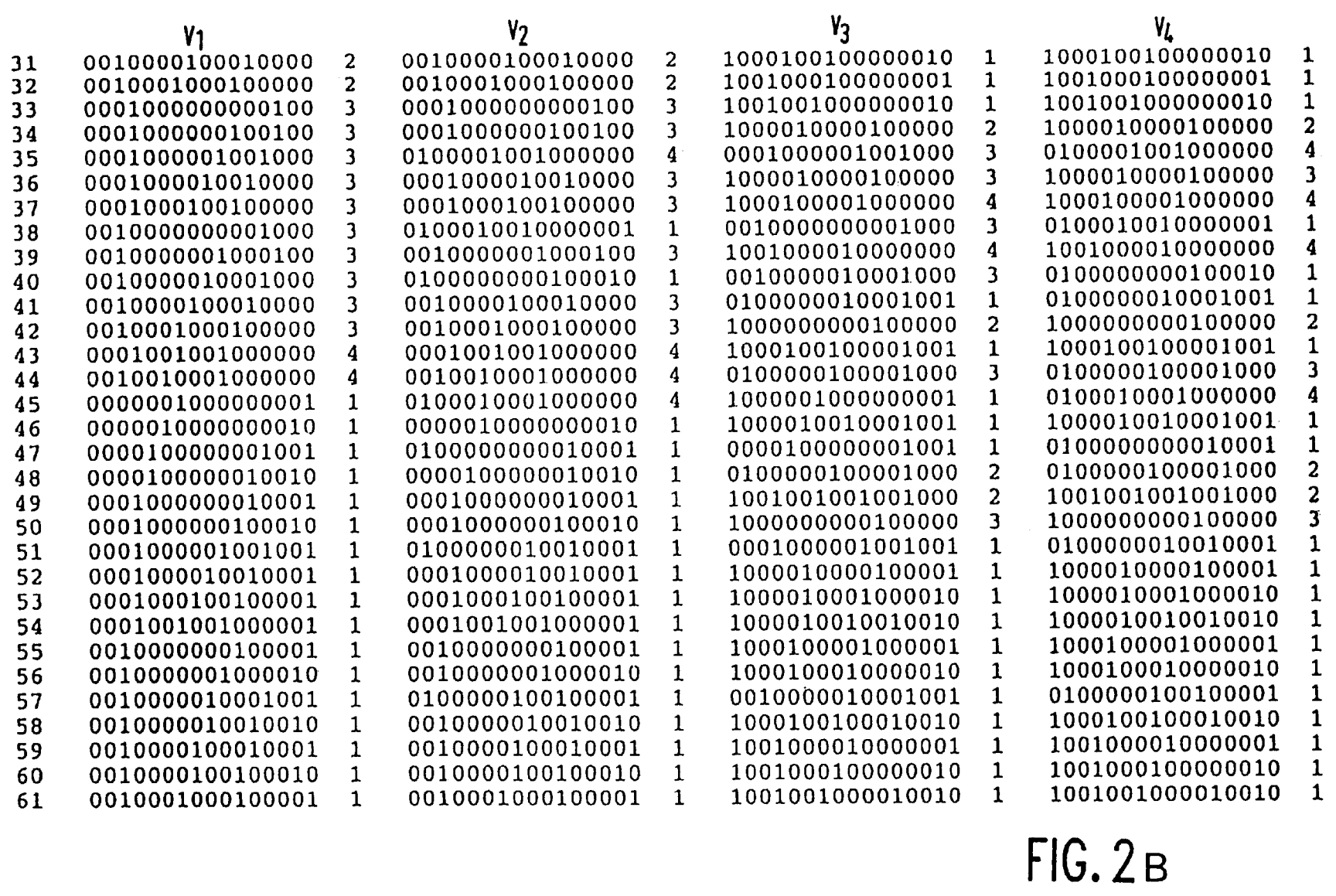
Figure 2C:
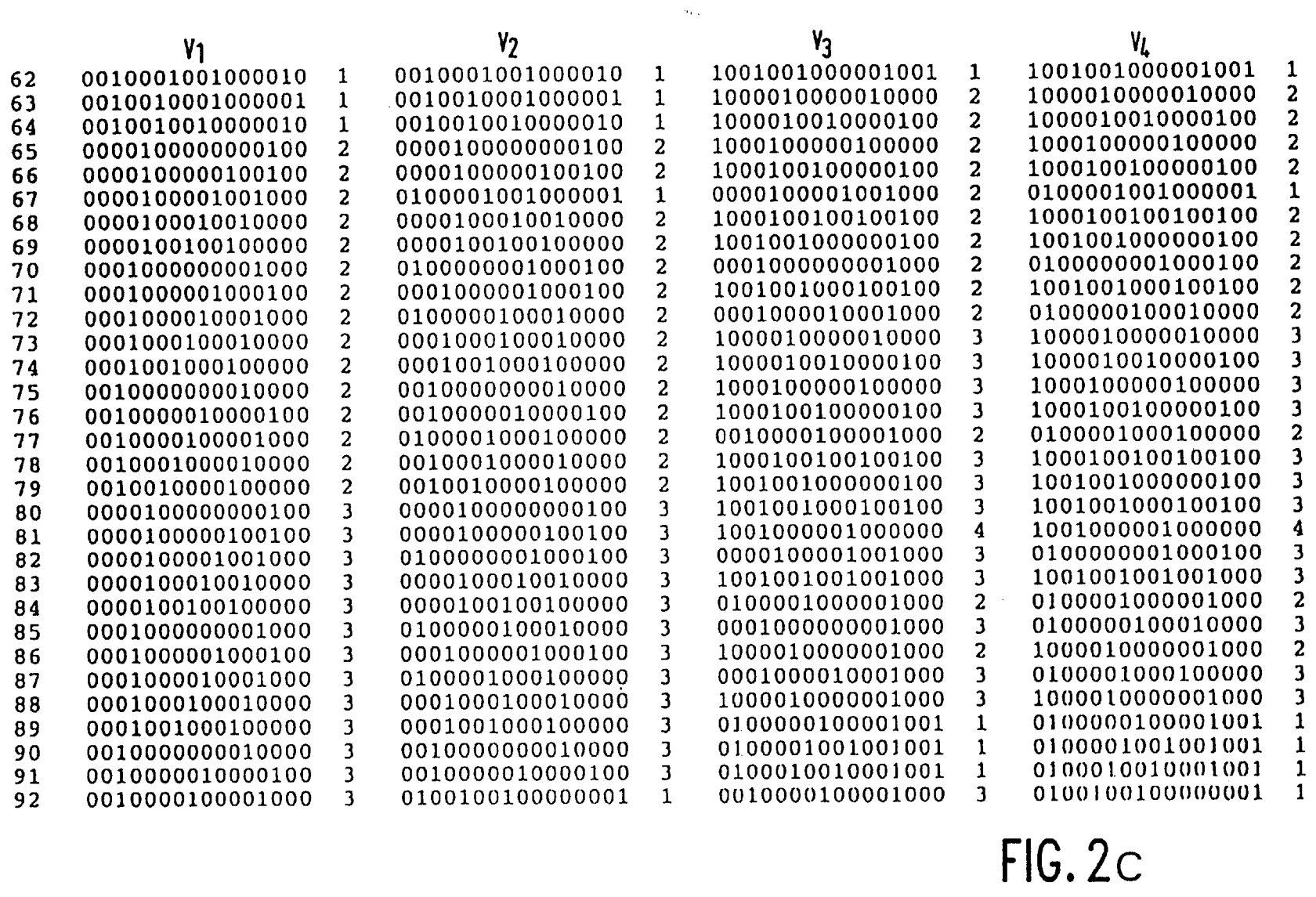
Figure 2D:
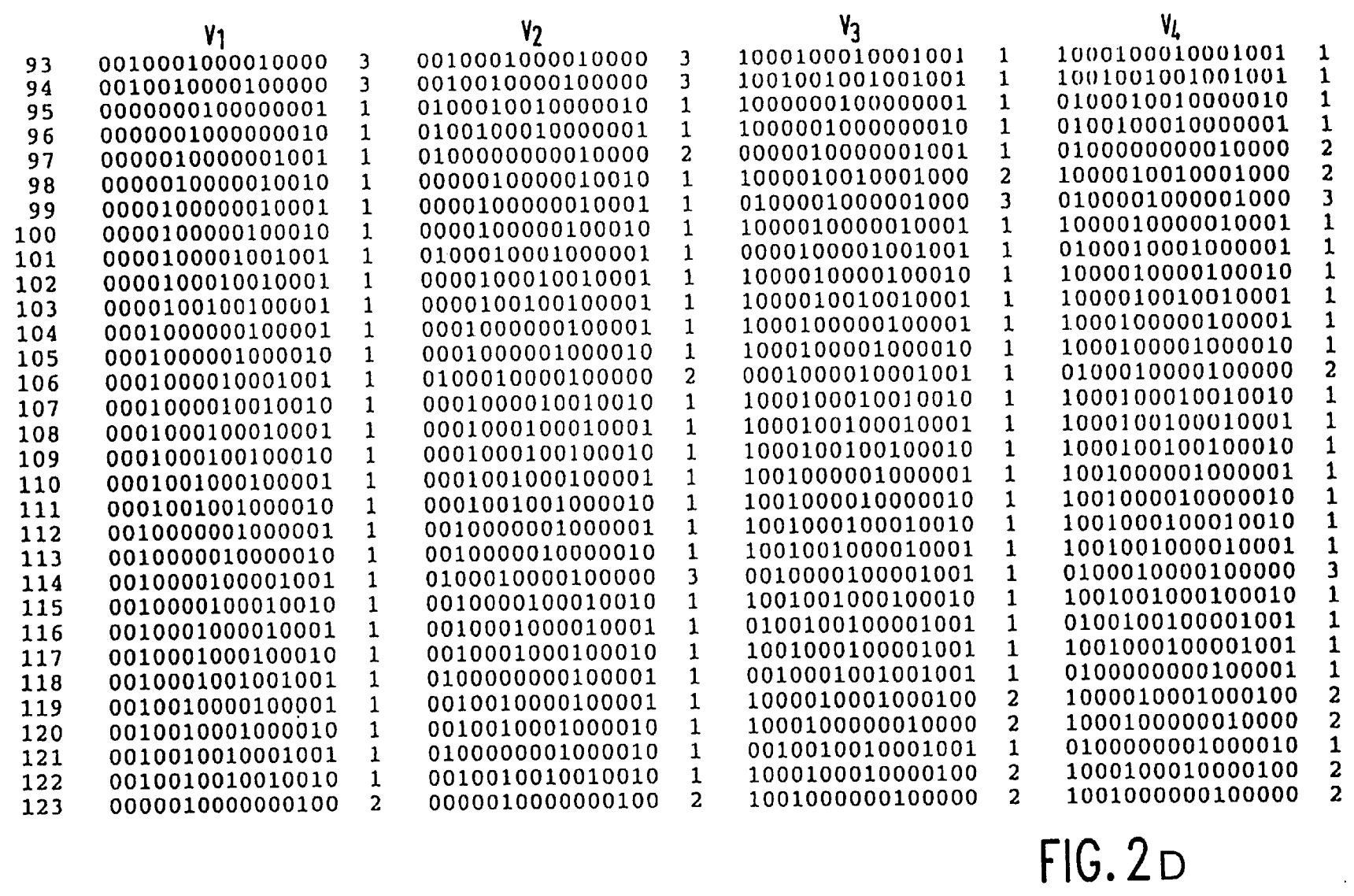
Figure 2E:
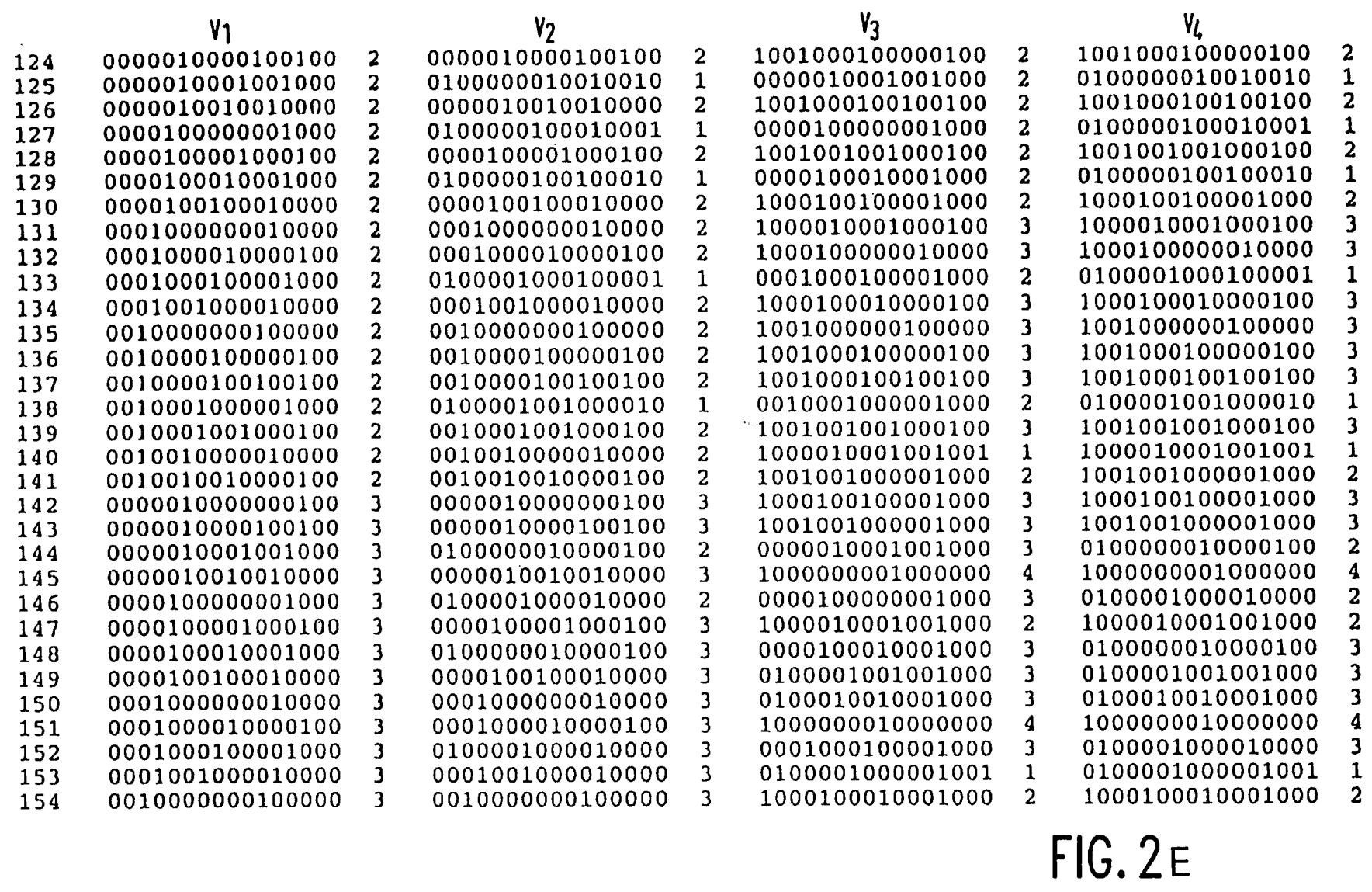
Figure 2G:
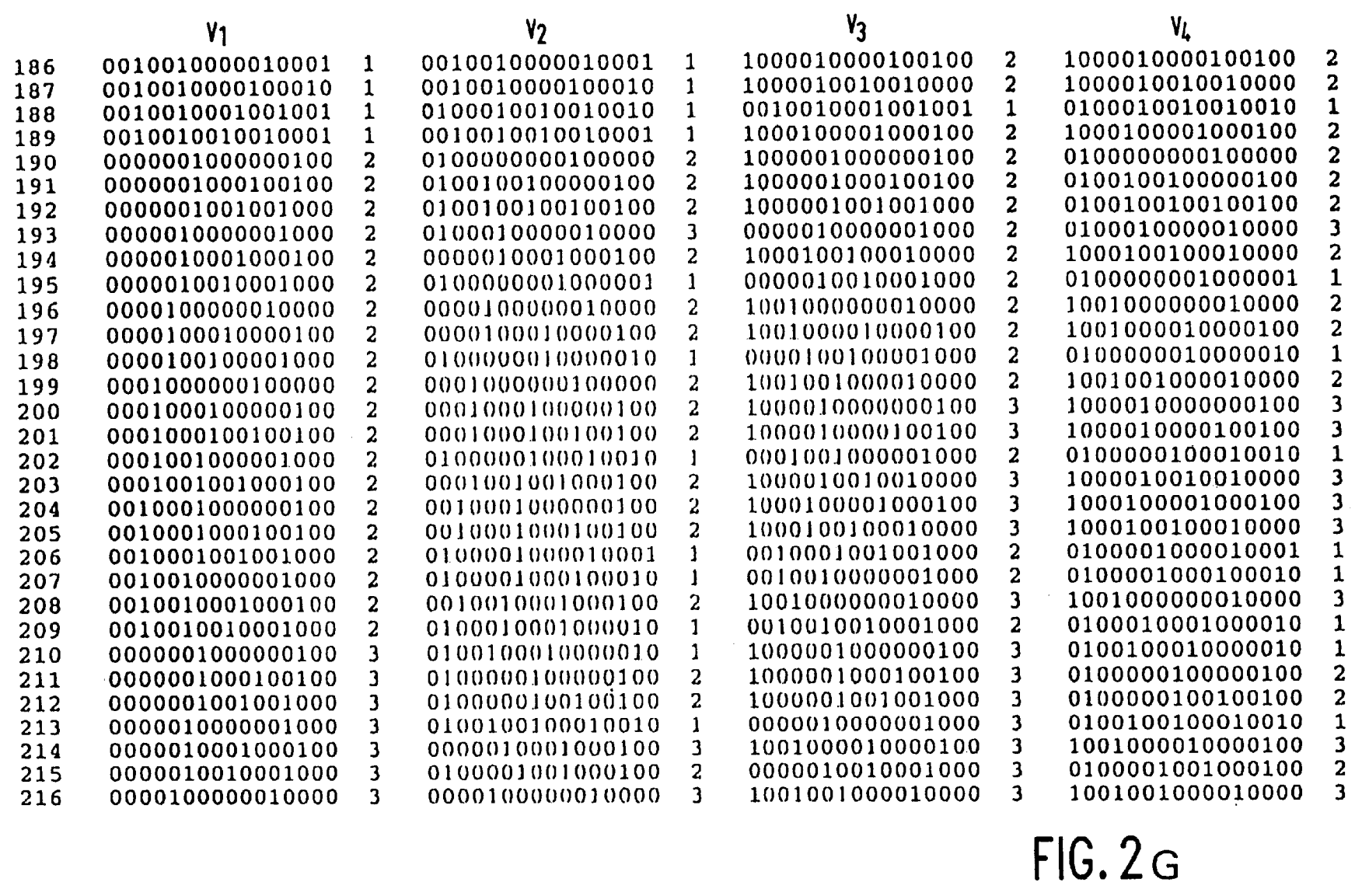
Figure 2H:
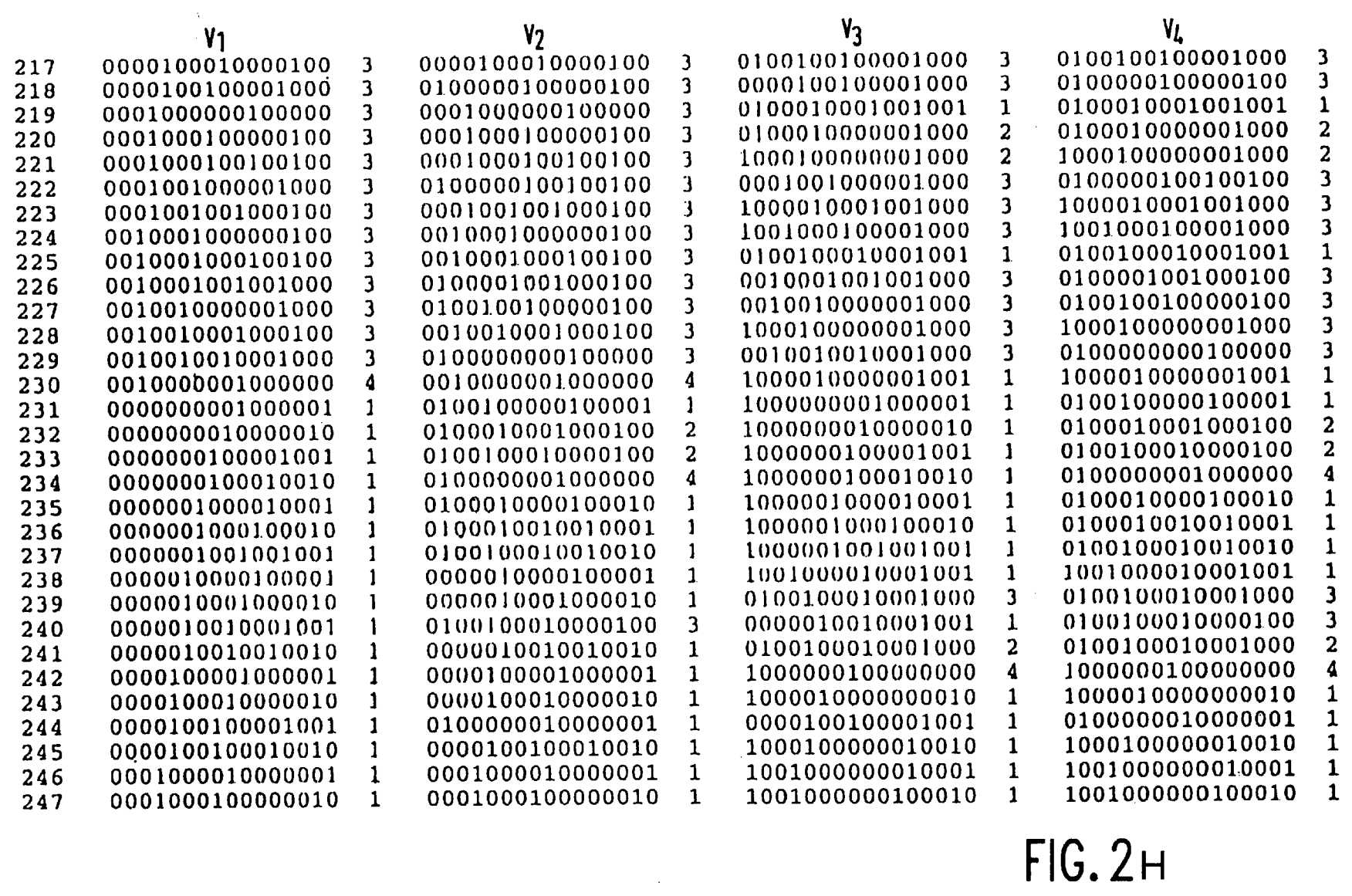

FIGS. 2A–J and 3A–C show tables in which the relation between the information words and code words is established;

FIG. 4 shows the values of various parameters as they are when a series of information words is converted to a series of code words;

FIGS. 6 and 8 show various embodiments for coding devices;

FIG. 9 shows possible bit patterns of suitable sync words;

FIG. 10 shows an adaptation of the coding device of FIG. 6 for the insertion of sync words;

FIG. 16 shows parts of a modulated signal and its corresponding code words; and

DETAILED DESCRIPTION OF THE PREFERRED EMBODIMENT

Figure 1:
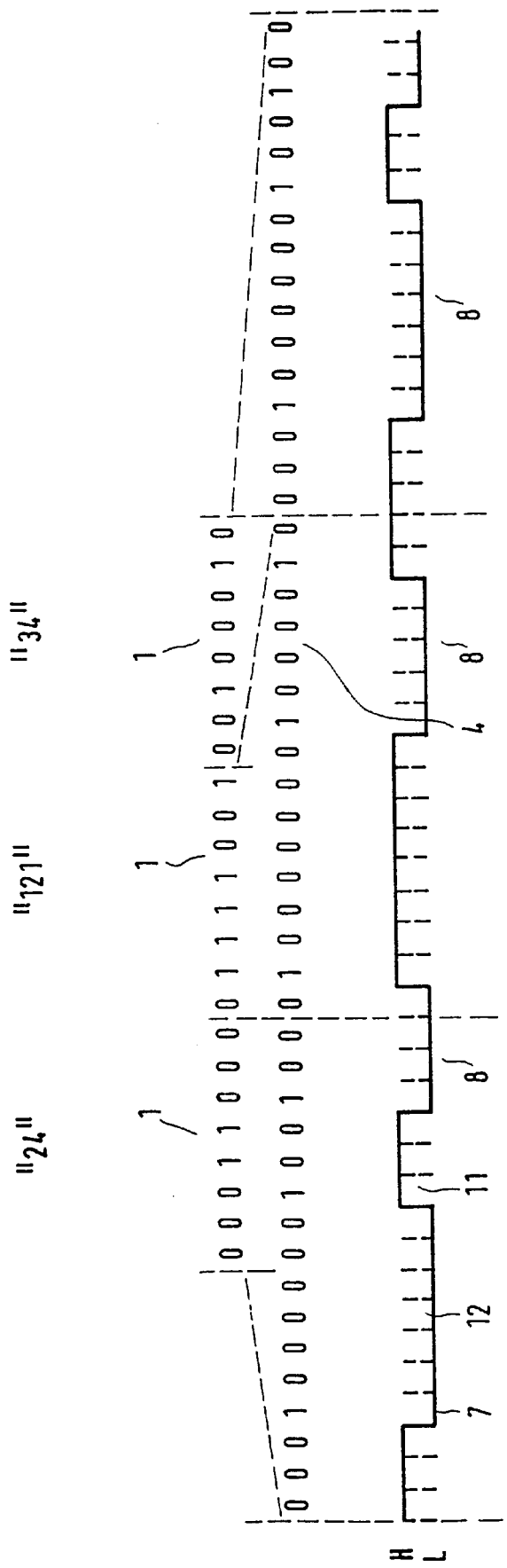
FIG. 1 shows a series of information words, a corresponding series of code words and a modulated signal.

FIG. 1 shows three consecutive m-bit information words, in this case, 8-bit information words referenced 1. The three information words 1 have the respective word values "24", "121" and "34". This series of 3 information words 1 is converted to three consecutive n-bit code words, in this case, 16-bit code words referenced 4. The code words 4 form a bit string of bits having a logical "0" value and bits having a logical "1" value. The conversion of the information words is such that in the bit string the minimum number of bits having a logical "0" value positioned between two bits having a logical "1" value is d and the maximum is k, where d is equal to 2 and k is equal to 10. Such a bit string is often referenced a RLL string (RLL=Run Length Limited) with a dk-constraint. The individual bits of the code words will further be referenced x1, . . . , x16, where x1 denotes the first bit (from the left) of the code word and x16 denotes the last bit of the code word.

The bit string formed by the code words 4 is converted to a modulated signal 7 by means of a modulo-2 integration operation. This modulated signal comprises three information signal portions 8 representing the code words 4. The information signal portions comprise bit cells 11 which may have a high signal value H or a low signal value L. The number of bit cells per information signal portion is equal to the number of bits of the associated code word. Each code word bit having a logical "1" value is indicated in the modulated signal 7 by a transition from a bit cell having the high signal value to a bit cell having the low signal value, or vice versa. Each code word bit having, the logical "0" value is indicated in the modulated signal 7 by the absence of a change of signal value at a bit cell transition.

Furthermore, the frequency spectrum of the modulated signal 7 is required to include substantially no low-frequency components. Worded differently, the modulated signal 7 is to be DC-free.

In the following an embodiment of the method according to the invention by which the modulated signal can be obtained will be described in detail.

Figure 17:
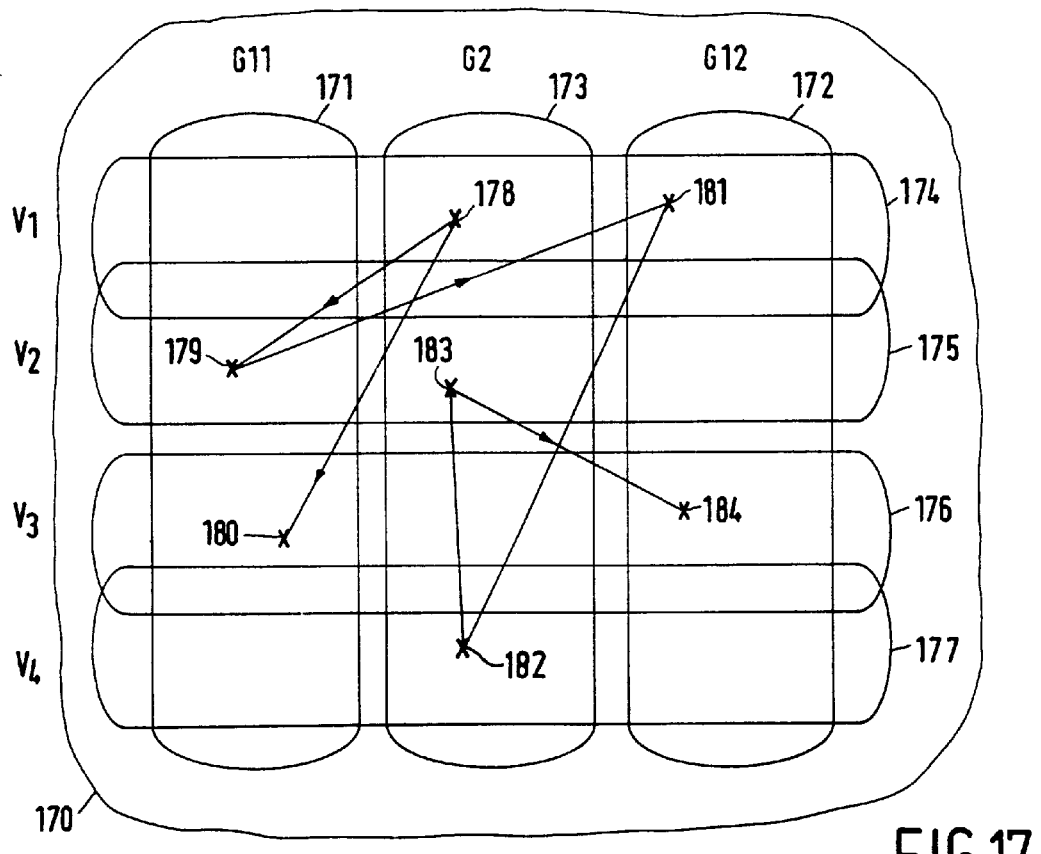
FIG. 17 gives a diagrammatic representation of the spreading of code words over groups and sets.

First there is a requirement with respect to the code words that within the code words the dk-constraint is satisfied. FIG. 17 diagrammatically shows the set of all the possible code words satisfying said dk-constraint in the zone enclosed by frame 170. The code words are divided into at least a group of a first type and at least a group of a second type. When a code word is delivered from one of the groups of the first type, a coding state is established which exclusively depends on the group of the first type to which the delivered code word belongs. When one of the code words of the group of the first type is delivered, a coding state is established which depends both on the group of the first type and on the information word represented by the delivered code word. In the embodiment described herein, two groups of the first type can be distinguished i.e. a first group G11 which comprises code words ending in a bits having a logical "0" value, where a is an integer equal to 0 or 1, and a second group G12 of code words ending in b bits having a logical "0" where with b is an integer smaller than or equal to 9 and greater than or equal to 6.

In FIG. 17 the code words belonging to group G11 lie in a frame 171. The code words belonging to group G12 lie in a frame 172.

The coding state established by the first group G11 of the first type will henceforth be referenced S1. The coding state established by the second group G12 of the first type will henceforth be referenced S4. The embodiment to be described here only knows one group of the second type. This group comprises code words ending in c bits having a logical "0" value, where c is an integer greater than or equal to 2 and smaller than or equal to 5. This group will henceforth be referenced group G2. In FIG. 17 the code words of group G2 lie in a frame 173. In the example to be described here, two coding states i.e. S2 and S3 can be established by the combination of a code word and associated information word.

When the information words are converted to code words, a code word belonging to a set of code words depending on the coding state is assigned to the information word to be converted. The sets of code words belonging to the coding states S1, S2, S3 and S4 will henceforth be referenced V1, V2, V3 and V4, respectively. The code words of the sets V1, V2, V3 and V4 lie in the frames 174, 175, 176 and 177. The code words in the sets are selected such that each bit string that can be formed by a code word from the group that has established a coding state and an arbitrary code word from the set established by this coding state satisfies the dk-constraint. In the case where the coding state S4 is established by the delivery of the previously delivered code word and the coding state thus denotes that the previous code word ends in a bit string having a logical "0" value greater than or equal to 6 and smaller than or equal to 9, code word set V4 which is established by the coding state S4 is only allowed to comprise code words beginning with a maximum of 1 bit having the logical "0" value. For that matter, code words beginning with a larger number of bits having the logical "0" value will have transitional areas between the previously delivered code word and the code word to be delivered, in which areas the number of successive bits having the logical "0" value will not always be smaller than or equal to 10 and thus not satisfy the dk-constraint. For similar reasons, set V1 comprises only code words beginning with a number of bits having the logical "0" value that is greater than or equal to 2 and smaller than or equal to 9.

Sets V2 and V3 of code words belonging to the coding states S2 and S3 contain only code words beginning with a number of bits having a logical "0" value greater than or equal to 0 and smaller than or equal to 5. The code words satisfying this condition are spread over the two sets V2 and V3, so that sets V2 and V3 do not contain any common code words at all. Sets V2 and V3 will be referenced disjunct sets irk the following. The spreading of the code words over sets V2 and V3 is preferably such that on the basis of the logical values of a limited number of p bits there can be determined to what set a code word belong. In the example described above, the bit combination x1.x13 is used for this purpose. Code words from set V2 are recognisable from the bit combination x1.x13=0.0. Code words from set V3 are then recognisable from the combination x1.x13 which is unequal to 0.0. A distinction is made between code words establishing coding state S1 (group G11) on delivery, code words establishing coding state S2 or S3 (group G2) on delivery, and code words establishing the coding state S4 (group G12) on delivery. Set V1 comprises 138 code words from group G11, 96 code words from group G2 and 22 code words from group G12. It will be evident that the number of different code words in set V1 is smaller than the number of different 8-bit information words.

Since the code words from group G2 are always followed by a code word from set V2 or a code word from set V3, and, in addition, based on the code word following a code word from group G2 there may be established what set this code word belongs to, a code word from group G2 followed by a code word from set V2 can be unequivocally distinguished from the same code word from group G2, but followed by a code word from set V3. Worded differently, when code words are assigned to an information word, each code word from group G2 can be used twice. Each code word from group G2 together with a random code word from set V2 forms a unique bit combination which is inseparable from the bit combination formed by the same code word and a random code word from the same set V3. This means that 138 unique bit combinations (code words) from group G11 can be used for set V1, 22 unique bit combinations (code words) from group G12 and 2*96 unique bit combinations (code words from group G2 combined with subsequent code words) from group G2. This brings the total number of useful unique bit combinations to 352. The number of unique bit combinations formed with the code words from. sets V2, V3 and V4 are 352, 351 and 415, respectively.

By way of illustration FIG. 17 shows a code word 178 belonging to group G2. This means that the next code word belongs either to set V2 or set V3. Code word 178 and the next code word are thus capable of unambiguously establishing two different information words. In FIG. 17 code word 178 followed by a code word from set V2, for example, code word 179, establishes a different information word from the one established by code word 178 followed by a code word from set V3, for example, code word 180. Code word 179 belongs to group G11, resulting in that code word 179 is always followed by a code word from set V1, regardless the information word to be coded next, so that code word 179 is capable of establishing not more than a single information word. The same holds for code word 180. The conversion of information words takes place as follows: Let us assume that the code word delivered last is code word 178 from group G2, the next code word will then belong either to set V2 or set V3, depending on the information word to be converted. Assuming that this information word establishes code word 179, this means that the next code word will belong to set V1. Which code word from set V1 is used is determined by the information word to be converted. In this example this is code word 181. Code word 181 belongs to group G12, so that the next code word will belong to set V4. Which code word this will be will again be established by the information word to be converted. In this example this is code word 182. Code word 182 belongs to group G2. This means that, depending on the information word corresponding to code word 182, the next code word comes either from set V2 or from set V3. Which of the code words from set V2 or V3 is used depends on the information word to be converted. In this example code word 182 is followed by code word 183. Code word 183 also belongs to group G2, so that, depending on the information word corresponding to code word 183, the next code word will come either from set V2 or V3. Which of the code words in the set is used again depends on the information word to be converted. In this case this is code word 184. In the manner described above any random series of information words can be uniquely converted to a series of code words.

In the foregoing an explanation has been given of the number of available code words extended by a subdivision of code words into groups of a first and a second type which establish a coding state, which coding states per se establish a set of code words from which a code word is to be selected for the conversion of a next information word. It is then essential that the sets of code words from which a selection is to be made do not have code words in common in the event of coding states laid down by code words from a group of the second type. As a result, it is possible to assign the same code word from a set of code words to different information words, provided that due care is taken that the code words following this same code word belong to different sets that do not hare code words in common. It will be obvious to a person skilled in the art that said subdivision of code words into sets and groups for obtaining code words to which more than one information word can be assigned can also be applied to code words having a different random number of bits. Neither is it necessary for the series of code words to satisfy a specific dk-constraint. Other constraints are possible, for example, as described in EP-A 0.319.101 (PHN 12.339).

As explained hereinbefore, a larger number of available unique bit combinations arises from the fact that more than one unique bit combination can be established with code words from the group(s) of the second type (G2). Generally, the subdivision of code words into groups and sets will be selected such that the number of available unique bit combinations is larger than the number of different information words. This surplus of unique bit combinations provides the possibility of imposing additional constraints on the conversion.

One possibility is utilizing only as many available unique bit combinations as there are different information words. In that case the surplus of unique bit combinations allows of imposing specific additional constraints on the code words.

However, it is to be preferred for one or more of the sets to assign a pair formed by two code words from the associated set to each of a number of information words, and then select either of the available code words from the pair according to a certain criterion on conversion, so as to influence a specific property of the modulated signal.

A highly attractive possibility is influencing the low-frequency component in the modulated signal. This influence preferably consists of minimizing the DC components. This may be effected by determining the digital sum value at the end of each information signal portion and selecting such code words when the information is converted, so that the digital sum value determined at the end of each information portion continues to be in the neighborhood of a certain reference value. This may be effected by assigning to a number of information words a pair of code words which effect different changes of the digital sum value. Preferably, each pair of code words comprises not more than two code words for which the changes of the digital sum values have opposite signs. For a given signal level at the end of the last information signal portion, the code word can then be selected for which the digital sum value will be nearest the reference value once the code word has been delivered.

Another possibility of selecting code words is selecting the code word for which, at the given signal level at the end of the code word delivered last, the sign of the digital sum value change caused by the associated code word will be opposite to that of the difference between the digital sum value prior to the delivery of the code word and the reference value. The selection of the code word to be delivered when a selection is possible from two code words having opposite influence on the digital sum value may then be simply made on the basis of the signal value at the end of each information signal portion and the sign of the difference between the digital sum value associated to this end and the reference value.

Figure 3B:
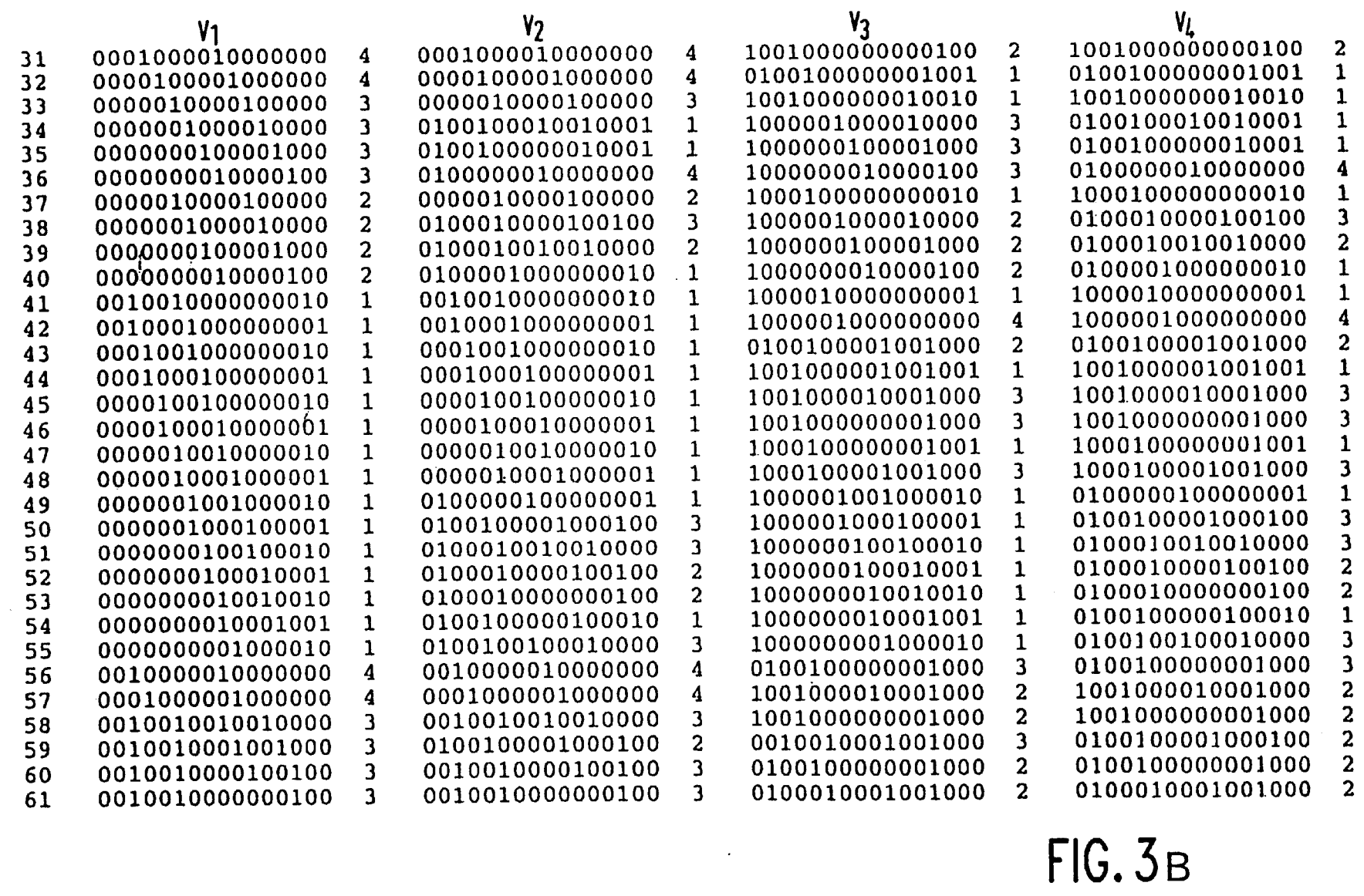
Figure 3C:
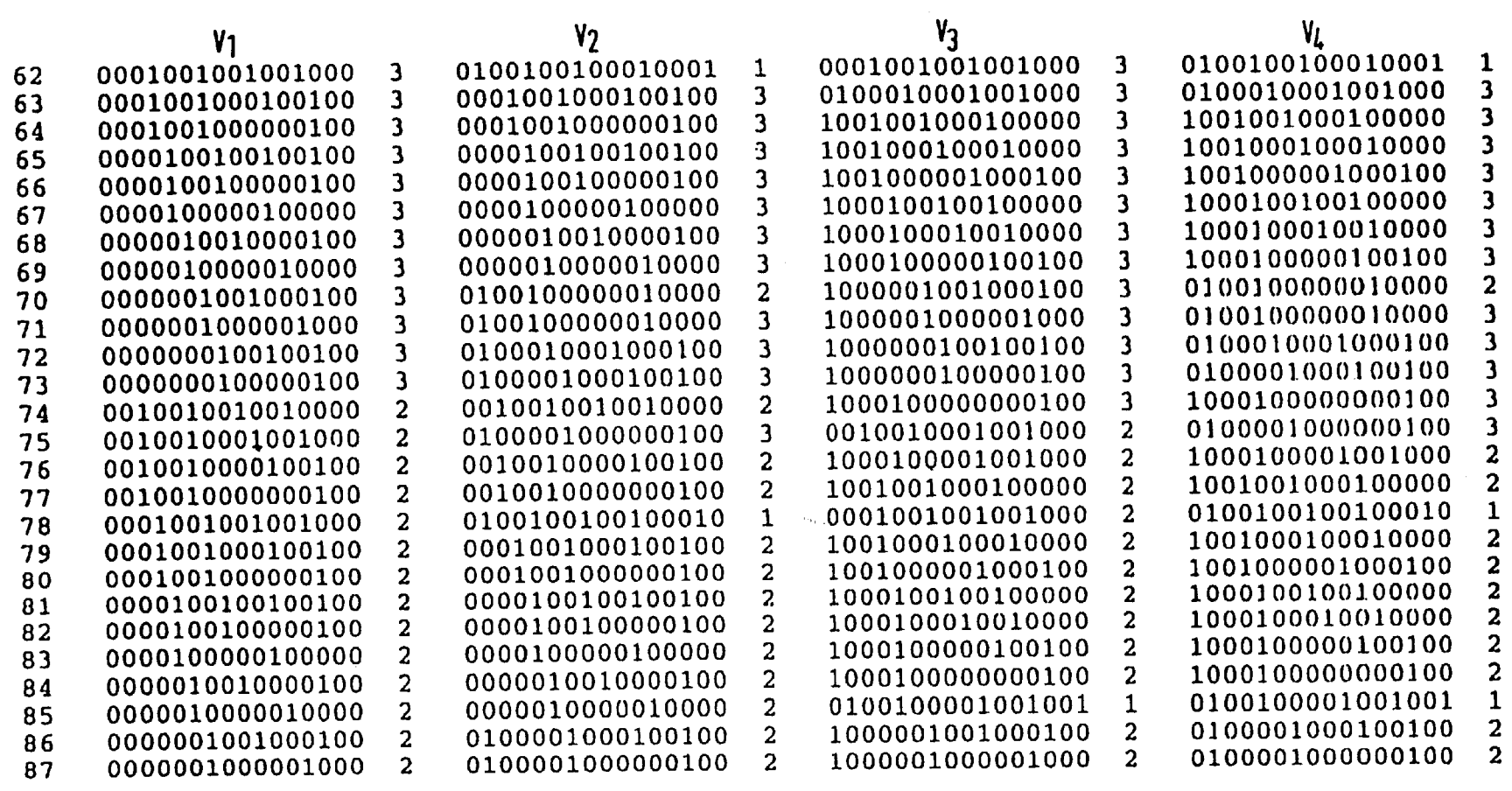

FIG. 2 shows by way of illustration for each of the sets V1, V2, V3 and V4 a code word assigned to each of the possible information words. In this Figure the first (left) column shows the word values of all possible information words. The second, fourth, sixth and eighth columns show the code words assigned to the information words from the respective sets V1, V2, V3 and V4. The third, fifth, seventh and ninth columns show by way of the respective digits 1, 2, 3 and 4 which of the coding states S1, S2, S3 and S4 are established by the associated code word. In FIG. 2 not more than 256 of the available code words are used for each of the sets V1, V2, V3 and V4. FIG. 3 shows, similarly to FIG. 2, the code words of the sets not shown in the table of FIG. 2 for 88 information words to which a pair of two code words is assigned. The code words represented in FIG. 3 will henceforth be referenced alternative code words. The assigning of code words to the information words is such that the change of the digital sum value caused by the alternative code words is the opposite to the change of the digital sum value caused by the code words of FIG. 2 which are assigned to the word values "0" to "87" inclusive.

It should be noted that all the sets in FIG. 3 contain equally many code words. It will be obvious to a man of ordinary skill in the art that this is not a necessity. It is equally possible that these sets are not equally large.

Furthermore, there is observed that the assignment of code words to the information words is chosen to be such that the relation between, on the one hand, the combination of a code word and the bits x1 and x13 of the next code word and, on the other hand, the information words, is unique, so that the decoding can exclusively be effected based unpon a received code word and the bits x1 and x13 of the next code word. For the code word assignment this means that if a code word occurs in different sets, the same code words in different sets represent the same information words. For example, the information word having the word value "2" is represented by "0010000000100100" in the sets V0 and V2 shown in FIG. 2 and by "1000000000010010" in the sets V2 and V3.

Needless to observe that it is not necessary that code words from different sets represent the same information words. However, this does mean that the coding state is to be recovered on decoding to reconstitute the original information word.

The conversion of a series of information words into a series of code words will be further explained with reference to FIG. 4.

Column IW shows from top to bottom the word values of a series of successive m-bit information words. For each of the information words for which a word value is included in column IW are shown a number of data. The column SW represents the coding state laid down when the code word was delivered, which code word was obtained as a result of the conversion of the preceding information word. This code word will henceforth be referenced preceding code word. The coding state in column SW denotes which of the sets V1, V2, V3 and V4 of code words is to be used for the conversion of the information word. Column LB shows the signal value of the modulated signal at the end of the information signal portion which portion corresponds with the code word obtained when the preceding information word was converted. This signal value will henceforth be referenced running information signal value. In the column D S V the digital sum value is shown which belongs to the running signal value of the modulated signal, the running modulated signal value.

Column CW shows the code words assigned to the information words of column IW according to the columns of FIGS. 2 and 3. In the case where a pair of code words is assigned to an information word, the two code words of the pair are shown, the upper code word of the pair corresponding to the table of FIG. 2 and the lower code word of the pair corresponding to the table of FIG. 3. Column dDSV shows the change in the digital sum value caused by the code word, assuming that the running modulated signal value would have had value "H".

Column DSVN shows the new digital sum value for the associated code word as this value would be for the case where the associated code word is delivered. Column L B N represents via a logical "1" that the signal value at the beginning and end of the information signal portion belonging to the code word are different. A logical "0" indicates that the signal values at the beginning and end of the associated information signal portion are equal. The signal value at the beginning and end of an information signal portion are different if the associated code word contains an odd number of "1" bits, which corresponds to an odd number of changes of signal levels in the information signal portion. With an even number of "1" bits in the code word, the signal value at the beginning and end of the information signal portion is the same. In the column SWN the coding state is shown which would be established in the case where the relevant code word is delivered.

Furthermore, column CS shows by an asterisk "*" which code word is actually delivered for the associated information word.

The first (top) word from the series of code words shown in column IW has a word value of "2". Let us assume that the coding state (column SW) is S1 when the conversion of the series of information words is initiated, and that the modulated signal begins with the signal level H and that the digital sum value D S V is equal to 0. In that case the associated DSVN value is equal to −6 for the upper code word, whereas the DSVN value is +10 for the lower code word of the pair. When the criterion is applied that the code word is delivered for which the DSVN value is nearest possible a reference value of 0, the upper of the two code words of the pair is delivered for the information word having the word value of "2". This means that the coding state for the next information word (word value "8") becomes S2. At the end of the information signal portion corresponding to the delivered code word, the signal value is L and the signal value at the beginning of the next information portion is thus L as is shown in column LB. The value of dDSV for the upper code word of the pair belonging to the information word having the word value of "8" is equal to −6. This value of −6 applies to the case where the signal value at the beginning of the associated information signal portion would be H. Since this signal value is L in the situation shown, the change of the digital sum value caused by the code word is not equal to −6, but +6. This means that DSVN becomes equal to 0. For the lower code word of the pair DSVN is equal to −18. The value of DSVN for the upper code word is nearest the value of 0, so that the upper code word is delivered. Subsequently, the information word having the word value of "100" is to be converted. Not more than one code word is assigned to this information word, so that a selection depending on DSVN is impossible for this information word. Similarly to the manner described above, the information words having the word values "230", "0", "61" and "255" are converted. Each time a conversion is to take place of an information word to which a pair of code words is assigned, that particular code word is selected from the pair for which the value of DSVN is nearest zero. In this manner the DC voltage level of the modulated signal is maintained at a substantially constant level and the frequency spectrum of the modulated signal will not show any low-frequency components. Although a set of code words is not available for each information word, an influencing of the digital sum value will nevertheless be possible for 88/256 of all the information words to be converted on average. In practice this appears to be amply sufficient to provide that the low-frequency component is absent in the modulated signal. It is to be preferred to include in the code word pairs those code words for which the change caused in the digital sum value is greatest. On the one hand, this is advantageous in that the digital sum value can be changed to its maximum. On the other hand, this means that the change caused in the digital sum value is relatively small for code words not belonging to the pair and that the influence of these code words on the digital sum value is relatively small.

Figure 5A:
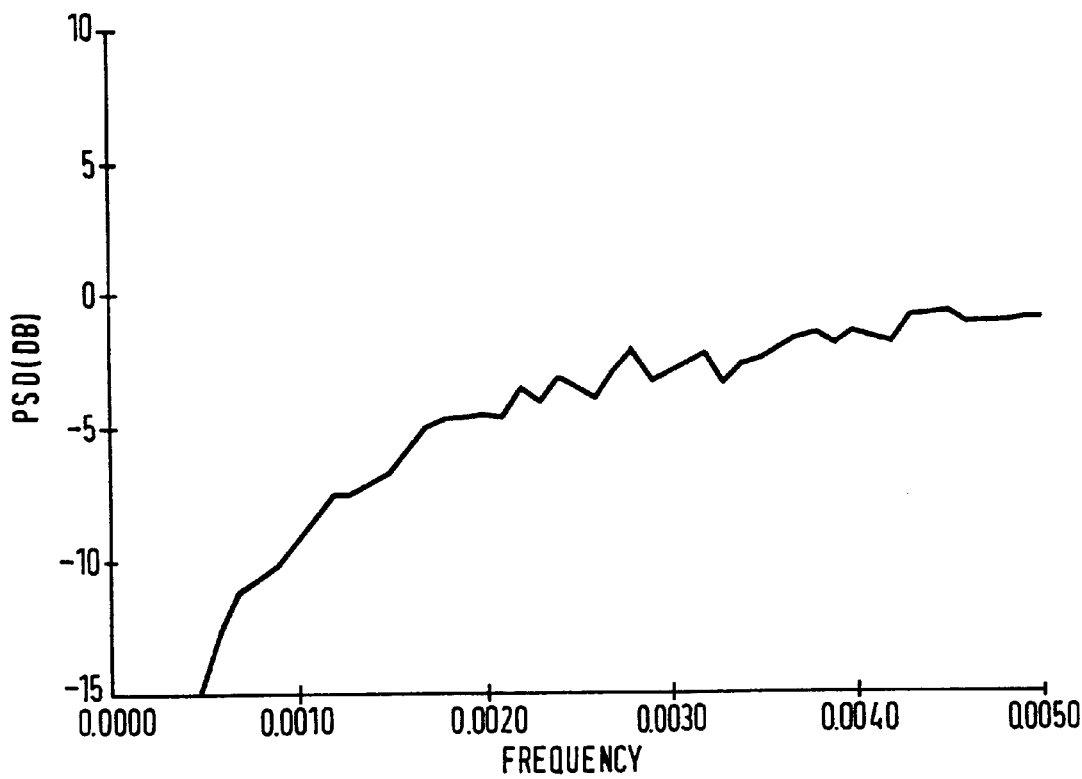
FIGS. 5a and 5b show the low-frequency portions of frequency spectra of various signals.
Figure 5B:
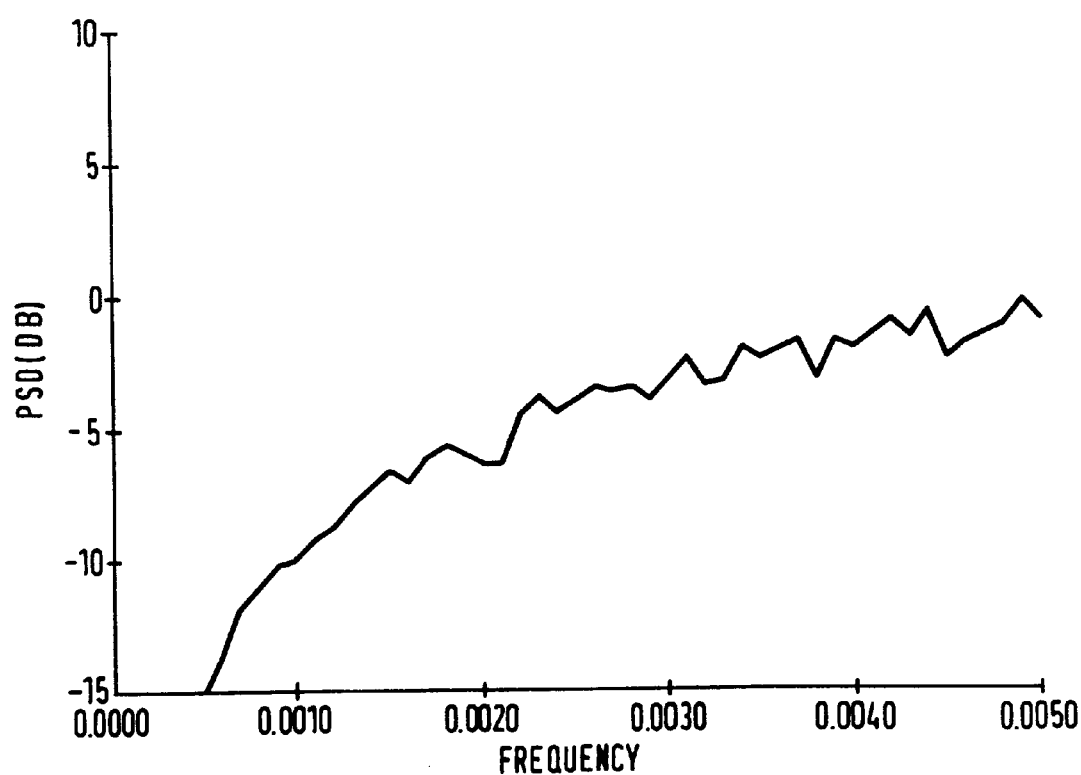

By way of illustration FIG. 5a shows the low-frequency portion of the frequency spectrum of a modulated signal obtained by implementing the method according to the invention. In FIG. 5b the corresponding low-frequency portion of the frequency spectrum of an EFM-modulated signal is plotted. As appears from the FIGS. 5a and 5b, the frequency spectra for the two signals are substantially the same. The dk-constraint for the EFM-modulated signal and the modulated signal obtained by implementing the method according to the invention is also substantially the same. The number of bit cells per information word in an EFM-modulated signal is equal to 17, whereas this is equal to 16 in a modulated signal according to the invention. This means that if the method according to the invention is implemented, an increase of information density of about 7% is obtained relative to an EFM-modulated signal, without this being at the cost of an increase of the low-frequency contents and without any concessions to the dk-constraint.

Figure 6:
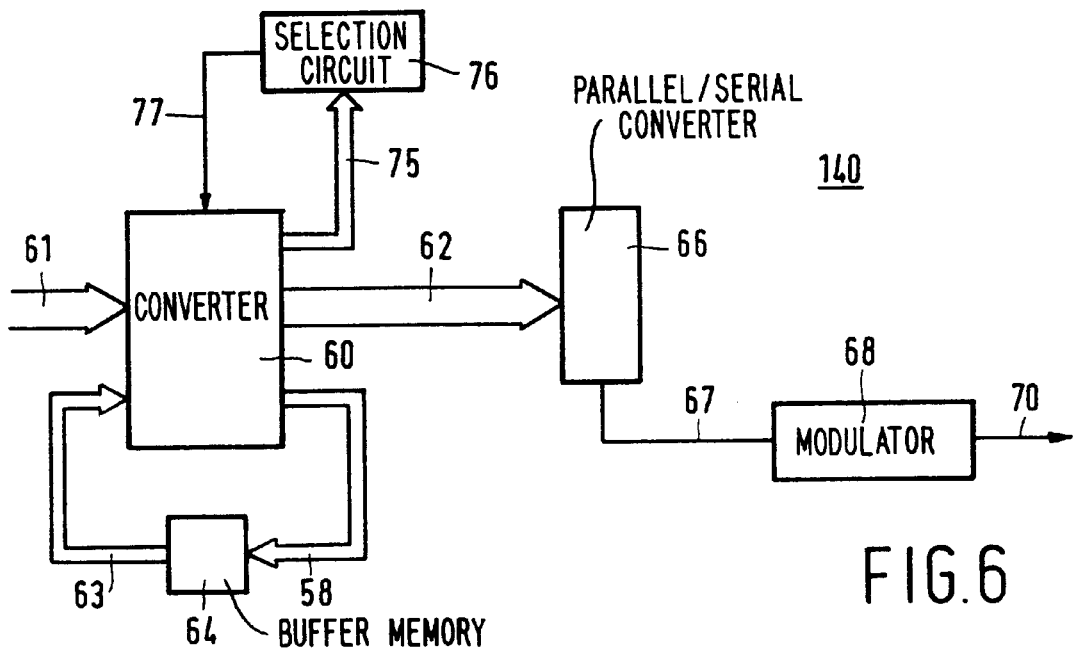

FIG. 6 shows an embodiment for a coding device 140 according to the invention by which the method described above can be carried out. The coding device is arranged for converting the m-bit information words 1 to the n-bit code words 4 and the number of different coding states can be indicated by s bits. The coding device comprises a converter 60 for converting (m+s+1) binary input signals to (n+s+t) binary output signals. From the inputs of the converter m inputs are connected to a bus 61 For receiving m-bit information words. From the outputs of the converter n outputs are connected to a bus 62 for delivering n-bit code words. Furthermore, s inputs are connected to an s-bit bus 63 for receiving a state word denoting the current coding state. A state word is delivered by a buffer memory 64, for example, in the form of s flip-flops. The buffer memory 64 has s inputs connected to a bus 58 for receiving a state word to be stored in the buffer memory. For delivering the state words to be stored in the buffer memory, s outputs of the converter 60 are used which are connected to bus 58.

Bus 62 is connected to the parallel inputs of a parallel-to-serial converter 66 which converts code words 4 received over bus 62 to a serial bit string to be supplied over a signal line 67 to a modulator circuit 68 which converts the bit string to the modulated signal 7 to be delivered over signal line 70. The modulator circuit 68 may be one of a customary type, for example, a so-termed modulo-2 integrator.

In addition to the code words and state words, the converter applies to a bus 75 for each received combination of information word and state word information which denotes whether for the associated state word the code word or a pair of code words is assigned to the associated information word, denotes for each of these assigned code words the change dDSV of the digital sum value caused by the code word as this change would be for a high signal value at the beginning of an information signal portion corresponding to this code word, denotes whether the number of "1" bits in the code word is odd or even.

For information transfer to a selection circuit 76 the bus 75 is connected to inputs of the selection circuit 76.

Based on this information the selection circuit 76 delivers a selection signal which indicates whether the code word to be fed to the bus 62 with the presented information word is to be converted in accordance with the relations laid down in the tables of FIG. 2, or in accordance with the relations laid down in the tables of FIG. 3. This selection signal is applied to the converter 60 over a signal line 77.

The converter 60 may comprise a ROM memory in which the code word tables shown in FIGS. 2 and 3 are stored at addresses determined by the combination of state word and information word applied to the inputs of the converter. In response to the detection signal, the addresses of the memory locations are selected with the code words corresponding to the table shown in FIG. 2 or the addresses of the memory locations with the code words corresponding to the table shown in FIG. 3.

In the embodiment shown in FIG. 6 the state words are stored in memory 60. Alternatively, it is possible to derive, by a gate circuit, only the state words from the code words delivered to the bus 62.

Figure 7:
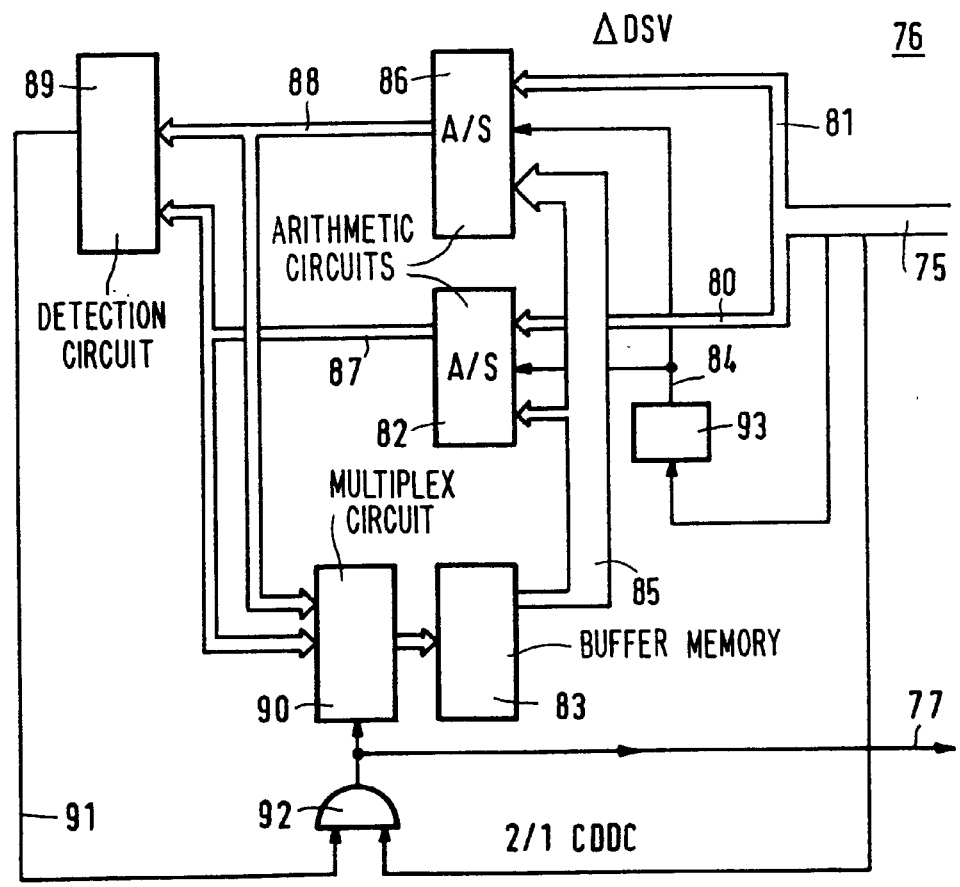
FIG. 7 shows an embodiment for a selection circuit to be used in the coding device shown in FIG. 6.

Instead of comprising a ROM memory, the converter may also comprise a combinatorial logical circuit formed by gate circuits. The synchronization of the operations executed in the arrangement may be obtained in customary fashion with synchronized clock signals which can be derived by a customary (not shown) clock generating circuit. FIG. 7 shows a possible embodiment for the selection circuit 76. Signal lines forming the bus 75 are split up into a sub-bus 80 and a sub-bus 81. The value of dDSV is transferred over sub-bus 80 for a code word from the table shown in FIG. 2 that is assigned in response to the received combination of state word and information word. Over sub-bus 81 is transferred the value of dDSV for the code word from the table shown in FIG. 3 in the case where this table contains a code word for the associated combination of state word and information word. Sub-bus 80 is connected to a first input of an arithmetic circuit 82. A second input of the arithmetic circuit 82 receives, over a bus 85, the value of D S V stored in a buffer memory 83. Furthermore, a control input of the arithmetic circuit receives a control signal over a signal line 84, which signal indicates whether the signal value at the beginning of the information signal portion corresponding to the associated code word has the high value H or the low value L. The signal on signal line 84 is obtained by means of, for example, a flip-flop whose state is constantly adapted when a code word is delivered, which adaptation takes place in response to a signal denoting whether the number of bits having a logical "1" value in the delivered code word is odd or even. This signal is delivered bit the converter 60 and supplied over one of the signal lines forming the bus 75. The arithmetic circuit 82 is one of a customary type subtracting or adding the value dDSV received over bus 80 from or to respectively, the value of D S V received over bus 85 in response to the control signal.

The selection circuit 76 comprises a further arithmetic circuit 86 which, similarly to the arithmetic circuit 82, adds the value of dDSV received over bus 81 to the value of D S V received over bus 85 or subtracts it therefrom in response to the control signal on signal line 84. The results of the operations performed by the arithmetic circuits 82 and 86 are applied over a bus 87, 88 respectively, to a decision circuit 89 and a multiplex circuit 90. These results represent, if a code word pair has been assigned to the presented state word, the new digital sum value changes DSVN that would be obtained on delivery of the two different code words of the pair. The decision circuit 89 is of a customary type which determines, in response to the values of DSVN received over the buses 87 and 88, which of the two received values is nearest a reference value, and which circuit 89 feeds a decision signal corresponding to this result to a signal line 91. In the event of a choice from two code words from a pair of code words, the decision signal indicates which of the two code words is to be delivered. This decision signal is applied to the signal line 77 through an AND-gate 92. In the case where not a pair of code words but only one code word is available, the signal on signal line 77 is to indicate that the information word delivered in accordance with the tables as shown in FIG. 2 is to be converted. To realise this, a second input of the AND-gate 92 is supplied with a signal coming from bus 75 which signal indicates whether not more than a single code word or a code word pair is available for the presented combination of state word and information word.

The signal line 77 is also connected to a control input of the multiplex circuit 90. Depending on the signal on its control input the multiplex circuit 90 passes the values of DSVN received over buses 87 and 88 on to an output belonging to the delivered code word. The output of the multiplex circuit 90 is coupled to the input of the buffer memory 83. The loading of the buffer memory is controlled in a customary fashion, so that the value of DSVN passed on by the multiplex circuit is stored in the buffer memory 83 when the selected code word is delivered.

In the case where a set of code words is available, for a presented information word in said embodiment for the coding device, the code word is selected from the pair for which the digital sum value is nearest a predetermined reference value when the associated code word is delivered. Another possibility of selecting code words from the code word pair is selecting that code word for which the sign of the digital sum value change, which change is caused by the delivery of the code word, is opposite to the sign of the digital sum value at the beginning of the delivery of the code word.

FIG. 8 shows an embodiment for a coding device according to the invention in which the code words are selected on the basis of said criterion. The coding device is again arranged for converting the m-bit information words 1 to the n-bit code words 4, while the number of different coding states can be represented by s bits. The coding device comprises a converter 50 for converting (m+s+1) binary input signals to (n+s) binary output signals. From the inputs of the converter m inputs are connected to a bus 51 for receiving m-bit information words. From the outputs of the converter n outputs are connected to a bus 52 for delivering n-bit code words. Furthermore, s inputs are connected to an s-bit bus 53 for receiving a state word that indicates the instantaneous coding state. The state word is delivered by a buffer memory comprising, for example, s flip-flops. The buffer memory 54 has s inputs connected to a bus for receiving a state word to be loaded in the buffer memory. For delivering the state words to be loaded in the buffer memory, s outputs of the converter 50 are used.

Bus 52 is connected to the parallel inputs of a parallel/serial converter 56 which converts the code words supplied over bus 52 to a serial bit string to be applied, over a signal line 57, to a modulator circuit 58 which converts the bit string to the modulated signal 7 to be delivered over a signal line 40. The modulator circuit 58 may be one of a customary type, for example, a modulo-2 integrator. The modulated signal 7 is applied to a circuit of a customary type for deriving the running digital sum value of the modulated signal 7. Circuit 59 delivers a signal Sdsv which depends on the determined digital sum value, which signal Sdsv denotes whether a code word is to be converted according to the relations laid down in FIG. 2 or a presented information word is to be converted according to the relations laid down in FIG. 3. The converter 50 may be of a similar type to converter 60 except for the fact that in the converter 50 only the code words and the associated state words need to be stored. The information supplied to the decision circuit 76 by the converter 60 over bus 75 is redundant in the embodiment shown in FIG. 8.

For the purpose of synchronization of the operations to be performed, the device comprises a clock generating circuit 41 of a customary type generating clock signals for controlling the parallel/serial converter 58 and for controlling the loading of the buffer memory 54.

Preferably, the modulated signal 7 comprises sync signal portions which have a signal pattern that cannot occur in a random sequence of information signal portions. The addition may be effected by inserting sync words into the sequence of n-bit code words. FIG. 9 shows two 26-bit sync words 100 and 101 which are pre-eminently suitable for use in combination with the code words shown in FIGS. 2 and 3. The sync words contain each two series of 10 bits having a logical "0" value separated by a bit having a logical "1" value. Only the logical value of the bit at the first location in the code word (x1) is different for the two sync words 100 and 101. Which of the two code words is inserted depends on the coding state determined by the code word situated immediately before the inserted sync word. In the case where the coding state S1 is determined, sync word 101 beginning with 3 bits having the logical "0" value is inserted. Since the code words determining the coding state S1 end in 1 bit having a logical "0" value at the most, the dk-constraint with d=2 and k=10 is satisfied when a transition is made from the code word to the sync word.

In the case where the coding state S4 is laid down, sync word 100 is inserted. Since the code words establishing the coding state S4 end in a minimum of 6 and a maximum of 9 bits having the logical "0" value, the dk-constraint with d=2 and k=10 is again satisfied at the transition from the code word to the sync word.

In the case where the coding state S2 is established, the sync word 101 is inserted. In this sync word the bit combination x1.x13 is equal to 0.0. In the case where the coding state S3 is established, the sync word 100 is inserted. In this sync word the bit combination x1.x13 is equal to 1.0. In the sync word following a code word that establishes the coding state S2, this bit combination x1.x13 is always 0.0 and for a sync word following a code word which establishes state S3 the bit combination x1.x13 is always 1.0, so that an associated information word is always unambiguously established on the basis of the code word and the next code word.

The sync words 100 and 101 both end in a bit having the logical "1" value, which means that the code word following either of these sync words is to be selected from the set V1 to provide that at the transition from the sync word to the next code word always the dk-constraint with d=2 and k=10 is satisfied. This means that the coding state S1 is established with each delivery of a code word.

FIG. 10 shows a modification of the coding device shown in FIG. 6 by which sync words can be inserted in the manner described above. In FIG. 10 like components to those of FIG. 6 are designated like reference characters. The modification relates to a memory 103 having two memory locations which store each either of the two sync words 100 and 101. The memory 103 comprises an addressing circuit for addressing either of the two memory locations in dependence on the state word applied to address inputs of the memory 103 over the bus 63. The sync word in the addressed memory location is applied to a parallel/serial converter 105 over a bus 104. The serial output of the converter 105 is applied to a first input of an electronically operable switching unit 106. The signal line 67 is connected to a second input of the switch unit 106. The coding device is controlled by a control circuit 107 of a customary type which alternately brings the coding device to a first or to a second state. In the first state a predetermined number of information words are converted to code words which are applied in the serial mode to the modulo-2 integrator 68 via the switch unit 106. At the transition from the first to the second state, the conversion of information words is interrupted and the sync word determined by the state word is delivered by memory 103 and applied to the modulo-2 integrator 68 via the parallel/serial converter 104 and the switch unit. In addition, at the transition from the second to the first state and under the control of the control circuit 107 the buffer memory is loaded with the state word that corresponds to the coding state S1 and, subsequently, the conversion from information words to code words is resumed until the coding device is again brought to the second state by the control circuit 107.

For the insertion of sync words, the coding device shown in FIG. 8 can be adapted in a way similar to the adaptation shown in FIG. 10.

Figure 11:
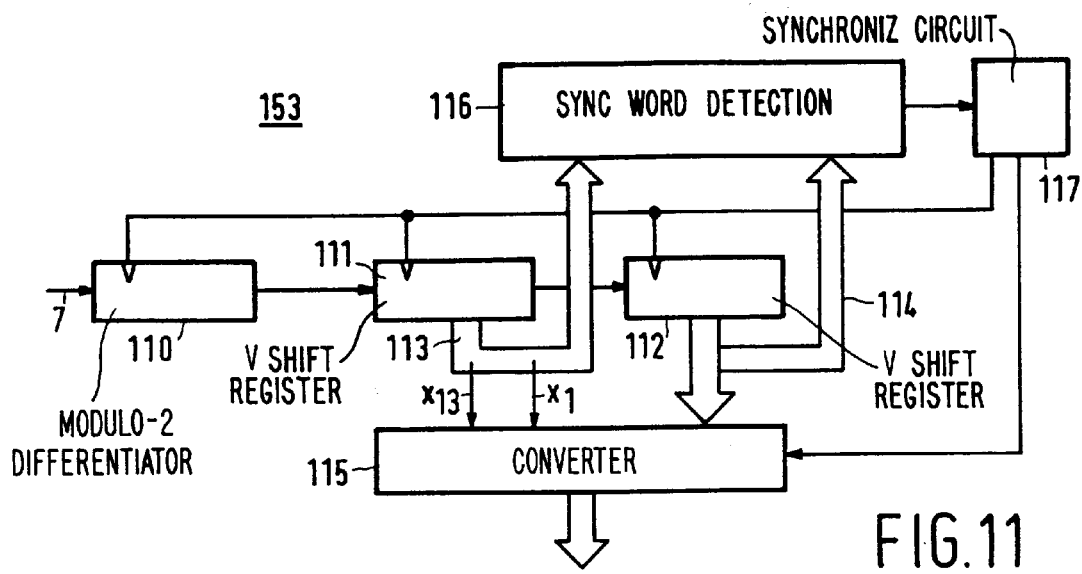
FIG. 11 shows a decoding device.

FIG. 11 shows an embodiment for a decoding device 150 according to the invention for reconverting modulated signals obtained with one of the methods described above to a sequence of information words. The decoding circuit comprises a modulo-2 differentiator 110 for converting the modulated signal to a bit string in which a bit having a logical "1" value represents a transition from a bit cell having a signal value L to a bit cell having a signal value H or vice versa and in which each bit cell having the logical "0" value represents two successive bit cells having the same signal value. The bit string thus obtained is applied to two series-connected shift registers having each a length corresponding to the length of an n-bit code word. The contents of the shift registers 111 and 112 are supplied to the respective buses 113 and 114 through parallel outputs. The decoding device comprises an (n+p)-to-m-bit converter 115. All the n bits present in shift register 112 are applied to inputs of converter 115 over bus 114. From the n bits present in the shift Register 111, p bits are applied to the converter 115 which p bits, together with the n bits in the shift register 114, uniquely establish an information word. The converter 115 may comprise a memory with a look-up table which contains an m-bit information word for each permitted bit combination formed by the n bits of an n-bit code word and the predetermined p bits of a bit string part following this code word. The converter, however, may also be realised by gate circuits.

The conversions performed by the converter 115 may be synchronized in customary fashion by means of a synchronizing circuit 117, so that each time a complete code word is loaded in the shift register 112, the information word is presented on the outputs of the converter which information word corresponds to the bit combination applied to the inputs of the converter 115.

Preferably, a sync word detector 116 connected to buses 113 and 114 and which detects a bit pattern corresponding to the sync words is used for the synchronization.

By way of illustration, FIG. 16 shows a signal that may be obtained in accordance with the invented method described above. The signal comprises a sequence of q successive information signal portions 160, where q is an integer, which signal portions represent q information words. Between the information signal portions are inserted sync signal portions, one of which being designated 161 in FIG. 16. A number of information signal portions are shown in detail. Each of the information signal portions 160 comprises n bit cells, in this case 16, which have a first (low) signal value L or a second (high) signal value H. Since the bit string formed by the code words and represented by the modulated signal satisfies a dk-constraint, the number of successive bit cells having the same signal value will at least be equal to d+1 and at most be equal to k+1. Due to the selection of the code words which depends on the digital sum value, the running value of the difference between the number of bit cells having the first signal value and the bit cells having the second signal value at an arbitrary point in the signal is essentially constant in the signal portion preceding this point. Each information signal portion corresponding to a code word from a group of the first type uniquely establishes an information word. In FIG. 16 this is, for example, information signal portion 160c which corresponds to code word "0100000001000010". This code word uniquely establishes the information word having the word value "121". Each information signal portion representing a code word from the group of the second type uniquely represents, together with an adjacent signal portion, an information word.

The information signal portion 160a shown in FIG. 16 corresponds to the code word "00010000000100100". This code word may establish both the information word having the word value "24" and the information word having the word value "34". What information is actually established by this code word is determined by the logical values on the first and thirteenth bit location of the immediately following portion of the bit string. If the logical values of these bits are both equal to 0, the information word having the word value "24" is established. If these bits are unequal to "0", the information word having the word value "34" is established. In FIG. 16 the values of the bits on the first and thirteenth locations behind the code word established by the information signal portion 160a are both equal to "0", so that the information word having the word value "24" is established. The code word established by the information signal portion 160*b* is identical with the code word established by the information signal portion 160*a*. The code word represented by the information signal portion 160*b*, however, is immediately followed by a sync word of which the first bit has the logical "1" value, so that now the information word having the word value "34" is established.

Figure 12:
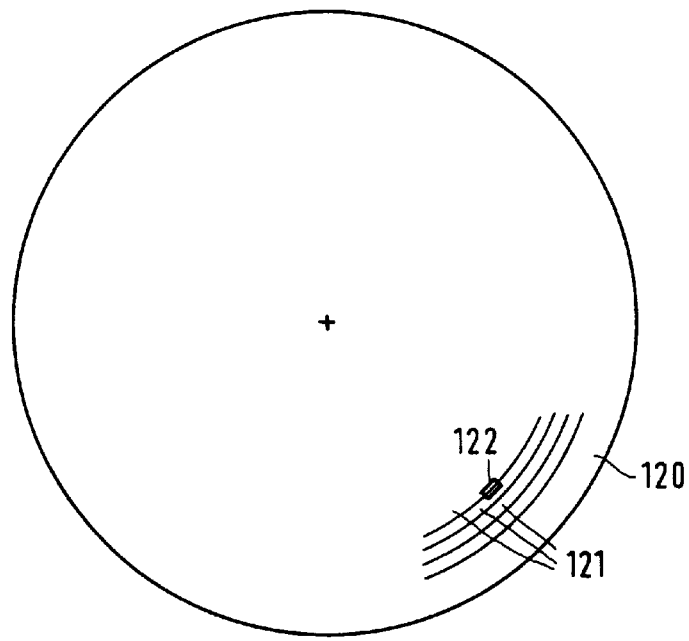
FIG. 12 shows a record carrier.
Figure 13:
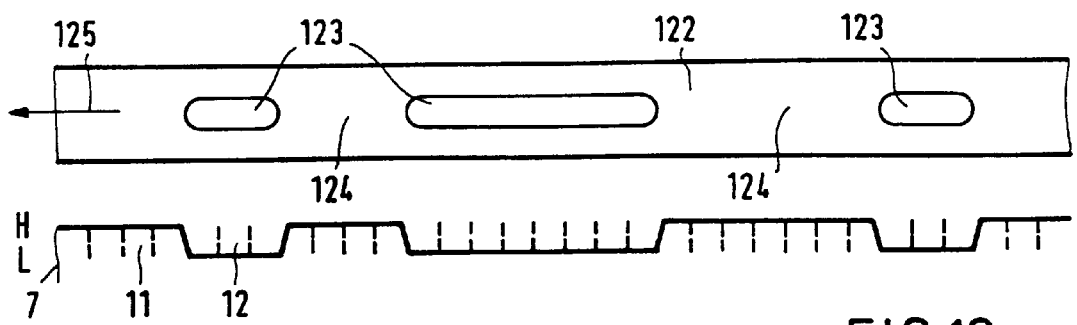
FIG. 13 shows a considerably enlarged portion of the record carrier of FIG. 12.

FIG. 12 shows by way of example, a record carrier 120 according to the invention. The record carrier shown is one of an optically detectable type. The record carrier may also be of a different type, for example, of a magnetically readable type. The record carrier comprises information patterns arranged in tracks 121. FIG. 13 shows a strongly enlarged portion 122 of one of the tracks 121. The information pattern in the track portion 121 shown in FIG. 13 comprises first sections 123, for example, in tie form of optically detectable marks and second sections 124, for example, intermediate areas lying between the marks. The first and second sections alternate in a direction of the track 125. The first sections 123 present first detectable properties and the second sections 124 present second properties which are distinguishable from the first detectable properties. The first sections 123 represent bit cells 12 of the modulated binary signal 7 having one signal level, for example, the low signal level L. The second sections 124 represent bit cells 11 having the other signal level, for example, the high signal level H. The record carrier 12 may be obtained by first generating the modulated signal and then providing the record carrier with the information pattern. If the record carrier is of an optically detectable type, the record carrier can then be obtained with mastering and replica techniques known per se based on the modulated signal 7.

Figure 14:
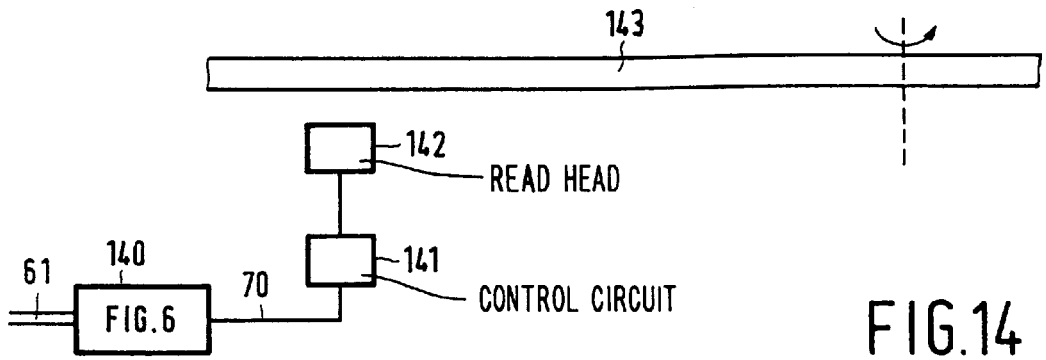
FIG. 14 shows a recording device.

FIG. 14 shows a recording device for recording information, in which the coding device according to the invention is used, for example, the coding device 140 shown in FIG. 6. In the recording device the signal line for delivering the modulated signal is connected to a control circuit 141 for a write head 142 along which a record carrier 143 of a writable type is moved. The write head 142 is of a customary type capable of introducing marks having detectable changes on the record carrier 143. The control circuit 141 may also be of a customary type generating a control signal for the write head in response to the modulated signal applied to the control circuit 141, so that the write head 142 introduces a pattern of marks that corresponds to the modulated signal.

Figure 15:
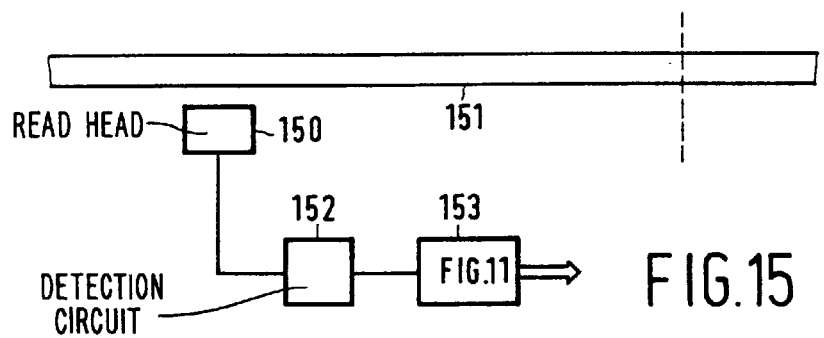
FIG. 15 shows a reading device.

FIG. 15 shows a reading device in which a decoding device according to the invention is used, for example, the decoding device 153 shown in FIG. 11. The reading device comprises a read head of a customary type for reading a record carrier according to the invention which record carrier carries an information pattern that corresponds to the modulated signal. The read head 150 then produces an analog read signal modulated according to the information pattern read out by the read head 150. Detection circuit 152 converts this read signal in customary fashion to a binary signal which is applied to the decoding circuit 153.

It will thus be seen that the objects set forth above and those made apparent from the preceding description are efficiently attained, and since certain changes can be made in the above method and construction set forth without departing from the spirit and scope of the invention, it is intended that all matter contained in the above description and shown in the accompanying drawings shall be interpreted as illustrative and not in a limiting sense.

It is also to be understood that the following claims are intended to cover all the generic and specific features of the invention herein described and all statements of the scope of the invention, which as a matter of language, might be said to fall therebetween.

I claim:

1. A record carrier having a signal recorded in a track, the signal comprising a sequence of successive information signal portions, each signal portion representing an information word wherein each of the information signal portions comprises n bit cells having a first or second signal value and wherein a plurality of track information patterns represent the signal portions, characterized in that the information signal portions are spread over at least one group of a first type and at least one group of a second type, while each information signal portion belonging to a group of the first type uniquely represents an information word and each information signal portion belonging to a group of the second type in combination with the signal values of p bit cells at predetermined positions in a following information signal portion represent a unique information word thereby allowing one information signal portion belonging to a group of the second type to represent a plurality of information words among which the respective information word is distinguishable by the signal values.

2. The record carrier as claimed in claim 1, characterized in that each number of successive bit cells having a same signal value ranges from a minimum of d+1 to a maximum of k+1, and at any arbitrary point in the signal the running value of the difference between the number of bit cells having the first signal value and the bit cells having the second signal value in the signal portion preceding this point is limited.

3. The record carrier as claimed in claim 2, characterized in that n is equal to 16, d is equal to 2 and k is equal to 10.

4. The record carrier as claimed in claim 3, characterized in that the signal comprises sync signal portions which have bit cell patterns that do not occur in the sequence of successive information signal portions, while a unique information word is established by each of the information signal portions of the second group combined with either an adjacent sync signal portion or an adjacent information signal portion.

5. The record carrier as claimed in claim 2, characterized in that the signal comprises sync signal portions which have bit cell patterns that do not occur in the sequence of successive information signal portions, while a unique information word is established by each of the information signal portions of the second group combined with either an adjacent sync signal portion or an adjacent information signal portion.

6. The record carrier as claimed in claim 2, characterized in that the information signal portions from the at least one group of the first type end in s bit cells having a first same signal value, and in that the information signal portions from the at least one group of the second type end in t bit cells having a same second signal value, wherein s and t can assume different values and wherein s and t are different in value.

7. The record carrier as claimed in claim 2, wherein the track information patterns comprise first and second parts alternating in the direction of the track, the first parts presenting detectable first properties and the second parts presenting second properties distinguishable from the first properties, and wherein the parts having the first properties represent bit cells having the first signal value and the parts having the second properties represent the bit cells having the second signal value.

8. The record carrier as claimed in claim 1, characterized in that the signal comprises sync signal portions which have bit cell patterns that do not occur in the sequence of successive information signal portions, while a unique information word is established by each of the information signal portions of the second group combined with either an adjacent sync signal portion or an adjacent information signal portion.

9. The record carrier as claimed in claim 8, characterized in that the information signal portions from the at least one group of the first type end in s bit cells having a same first signal value, and in that the information signal portions from the at least one group of the second type end in t bit cells having a same second signal value, wherein s and t can assume different values and wherein s and t are different in value.

10. The record carrier as claimed in claim 8, wherein the track information patterns comprise first and second parts alternating in the direction of the track, the first parts presenting detectable first properties and the second parts presenting second properties distinguishable from the first properties, and wherein the parts having the first properties represent bit cells having the first signal value and the parts having the second properties represent the bit cells having the second signal value.

11. The record carrier as claimed in claim 1, characterized in that p is equal to 2.

12. The record carrier as claimed in claim 1, characterized in that the information signal portions from the at least one group of the first type end in s bit cells having a first same signal value, and in that the information signal portions from the at least one group of the second type end in t bit cells having a same second signal value, wherein s and t can assume different values and wherein s and t are different in value.

13. The record carrier as claimed in claim 12, characterized in that t is greater than or equal to 2 and smaller than or equal to 5.

14. The record carrier as claimed in claim 12, wherein the track information patterns comprise first and second parts alternating in the direction of the track, the first parts presenting detectable first properties and the second parts presenting second properties distinguishable from the first properties, and wherein the parts having the first properties represent bit cells having the first signal value and the parts having the second properties represent the bit cells having the second signal value.

15. The record carrier as claimed in claim 1, wherein the track information patterns comprise first and second parts alternating in the direction of the track, the first parts presenting detectable first properties and the second parts presenting second properties distinguishable from the first properties, and wherein the parts having the first properties represent bit cells having the first signal value and the parts having the second properties represent the bit cells having the second signal value.

16. The record carrier as claimed in claim 15, wherein said properties are optically detectable.

* * * * *